US011592344B2

(12) United States Patent
Lee et al.

(10) Patent No.: US 11,592,344 B2
(45) Date of Patent: Feb. 28, 2023

(54) STRETCHABLE STRAIN SENSORS AND DEVICES

(71) Applicant: Samsung Electronics Co., Ltd., Suwon-si (KR)

(72) Inventors: Gae Hwang Lee, Seongnam-si (KR); Youngjun Yun, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 206 days.

(21) Appl. No.: 17/104,549

(22) Filed: Nov. 25, 2020

(65) Prior Publication Data

US 2021/0333162 A1    Oct. 28, 2021

(30) Foreign Application Priority Data

Apr. 24, 2020 (KR) .................. 10-2020-0049881

(51) Int. Cl.
*H01L 51/50* (2006.01)
*G01L 1/24* (2006.01)

(52) U.S. Cl.
CPC .......... *G01L 1/241* (2013.01); *H01L 51/502* (2013.01); *H01L 51/5036* (2013.01)

(58) Field of Classification Search
CPC ............ G01L 1/241; G01L 1/24; G01L 5/16; G01B 11/16
See application file for complete search history.

(56) References Cited

U.S. PATENT DOCUMENTS

| 10,381,134 | B2 | 8/2019 | Chopra et al. | |
| 2014/0046191 | A1* | 2/2014 | Anker | A61B 5/1127 600/407 |
| 2019/0390985 | A1 | 12/2019 | Kwok et al. | |

FOREIGN PATENT DOCUMENTS

| KR | 10-0368122 B1 | 1/2003 |
| KR | 10-1733343 B1 | 5/2017 |

OTHER PUBLICATIONS

Park et al, "A skin-integrated transparent and stretchable strain sensor with interactive color-changing electrochromic displays", Nanoscale pp. 7631-7640. (Year: 2017).*
Oh, Jin Young et al., "Stretchable self-healable semiconducting polymer film for active-matrix strain-sensing array", Science Advances, Materials Science, vol. 5: eaav3097, Nov. 8, 2019.
Park, Tae Hyun et al., "Block copolymer structural color strain sensor", NPG Asia Materials, vol. 10, pp. 328-339, DOI: 10.1038/s41427-018-0036-3 (2018).
Douglas A. Park et al. "Force-induced activation of covalent bonds in mechanoresponsive polymeric materials".
Zhao, Pengfei et al., "Stretchable photonic crystals with periodic cylinder shaped air holes for improving mechanochromic performance", (2019).

* cited by examiner

*Primary Examiner* — Donald L Raleigh
(74) *Attorney, Agent, or Firm* — Harness, Dickey & Pierce, P.L.C.

(57) ABSTRACT

A stretchable strain sensor may exhibit wavelength selectivity according to a thickness change of a thickness of the stretchable strain sensor, in a thickness direction extending parallel to the thickness of the stretchable strain sensor, due to elongation of the stretchable strain sensor in an elongation direction extending perpendicular to the thickness direction. The stretchable strain sensor may have an emission spectrum that changes according to strain variation of a strain on the stretchable strain sensor.

15 Claims, 19 Drawing Sheets

STRETCHABLE STRAIN SENSORS AND DEVICES

CROSS-REFERENCE TO RELATED APPLICATION

This application claims priority to and the benefit, under 35 U.S.C. § 119, of Korean Patent Application No. 10-2020-0049881 filed in the Korean Intellectual Property Office on Apr. 24, 2020, the entire contents of which are incorporated herein by reference.

BACKGROUND

1. Field

Stretchable strain sensors and devices are disclosed.

2. Description of the Related Art

Strain sensors are configured to sense a degree of physical deformation due to external force, and may be applied to (e.g., included in) wearable devices attached to a living body or clothing in recent years or variously applied (e.g., used) to confirm physical deformation of an object.

SUMMARY

Some example embodiments provide a stretchable strain sensor that may be effectively applied to a living body or object.

Some example embodiments provide a device including the stretchable strain sensor.

According to some example embodiments, the stretchable strain sensor may be configured to exhibit wavelength selectivity according to a thickness change of a thickness of the stretchable strain sensor, in a thickness direction extending parallel to the thickness of the stretchable strain sensor, due to elongation of the stretchable strain sensor in an elongation direction extending perpendicular to the thickness direction.

The stretchable strain sensor may include an optoelectronic device, and the optoelectronic device may be configured to display a color according to the thickness change of the thickness of the stretchable strain sensor in the thickness direction due to elongation of the stretchable strain sensor in the elongation direction.

The optoelectronic device may be configured to display a color of a first wavelength spectrum in response to the stretchable strain sensor being elongated in the elongation direction at a first elongation rate, may be configured to display a color of a second wavelength spectrum in response to the stretchable strain sensor being elongated in the elongation direction at a second elongation rate, the second wavelength spectrum being different from the first wavelength spectrum, the second elongation rate being higher than the first elongation rate, and may be configured to display a color of a third wavelength spectrum in response to the stretchable strain sensor being elongated in the elongation direction at a third elongation rate, the third wavelength spectrum being different from the first wavelength spectrum and the second wavelength spectrum, the third elongation rate being higher than the second elongation rate.

The second wavelength spectrum may be a shorter wavelength spectrum than the first wavelength spectrum, and the third wavelength spectrum may be a shorter wavelength spectrum than the second wavelength spectrum.

The optoelectronic device may be configured to not display a color in response to the stretchable strain sensor being elongated in the elongation direction at an elongation rate that is below a threshold elongation rate and may be configured to display the color in response to the stretchable strain sensor being elongated in the elongation direction at an elongation rate that is at or above the threshold elongation rate.

The optoelectronic device may be configured to display a color in response to the stretchable strain sensor being elongated in the elongation direction at an elongation rate that is below a threshold elongation rate and may be configured to not display the color in response to the stretchable strain sensor being elongated in the elongation direction at an elongation rate that is at or above the threshold elongation rate.

The optoelectronic device may be configured to display a color in response to the stretchable strain sensor being elongated in the elongation direction at an elongation rate that is within a range between a first threshold elongation rate and a second threshold elongation rate, and may be configured to not display the color in response to the stretchable strain sensor being elongated in the elongation direction at an elongation rate that is outside the range between the first threshold elongation rate and the second threshold elongation rate, so as to be below the first threshold elongation rate or above the second threshold elongation rate.

The optoelectronic device may include a first electrode including a reflective layer, a second electrode facing the first electrode and spaced apart from the reflective layer by an optical path length, and a light emitting layer between the first electrode and the second electrode.

As the elongation rate increases, the optical path length may be shorter, and the optoelectronic device may be configured to display a color of a wavelength spectrum corresponding to the optical path length according to the change in the optical path length.

The light emitting layer may be configured to emit white light, and the optoelectronic device may be configured to display a color of a portion of a visible light spectrum.

The optoelectronic device may be configured to display a color of a first wavelength spectrum in response to the stretchable strain sensor being elongated in the elongation direction at a first elongation rate, may be configured to display a color of a second wavelength spectrum in response to the stretchable strain sensor being elongated in the elongation direction at a second elongation rate, the second wavelength spectrum being a shorter wavelength region than the first wavelength spectrum, the second elongation rate being higher than the first elongation rate, and may be configured to display a color of a third wavelength spectrum in response to the stretchable strain sensor being elongated in the elongation direction at a third elongation rate, the third wavelength spectrum being a shorter wavelength region than the second wavelength spectrum, the third elongation rate being higher than the second elongation rate.

The light emitting layer may be configured to emit light of one wavelength spectrum of a red wavelength spectrum, a green wavelength spectrum, or a blue wavelength spectrum, and the optoelectronic device may be configured to not display a color corresponding to the one wavelength spectrum in response to the stretchable strain sensor being elongated in the elongation direction at an elongation rate that is below a threshold elongation rate and may be configured to display the color in response to the stretchable strain sensor being elongated in the elongation direction at an elongation rate that is at or above the threshold elongation rate.

The light emitting layer may be configured to emit light of one wavelength spectrum of a red wavelength spectrum, a green wavelength spectrum, or a blue wavelength spectrum, and the optoelectronic device may be configured to display a color corresponding to the one wavelength spectrum in response to the stretchable strain sensor being elongated in the elongation direction at an elongation rate that is below a threshold elongation rate and may not configured to not display the color in response to the stretchable strain sensor being elongated in the elongation direction at an elongation rate that is at or above the threshold elongation rate.

The light emitting layer may be configured to emit light of one wavelength spectrum of a red wavelength spectrum, a green wavelength spectrum, or a blue wavelength spectrum, and the optoelectronic device may be configured to display a color corresponding to the one wavelength spectrum in response to the stretchable strain sensor being elongated in the elongation direction at an elongation rate that is within a range between a first threshold elongation rate and a second threshold elongation rate and may be configured to not display the color in response to the stretchable strain sensor being elongated in the elongation direction at an elongation rate that is outside the range between the first threshold elongation rate and the second threshold elongation rate, so as to be either below the first threshold elongation rate or above the second threshold elongation rate.

The second electrode may be a semi-transmissive electrode.

Each of the first electrode and the second electrode may be a stretchable electrode.

The stretchable strain sensor may further include a stretchable substrate configured to structurally support the optoelectronic device.

The stretchable substrate may include a first region having a first elastic modulus and a second region adjacent to the first region and having a second elastic modulus, the second elastic modulus being lower than the first elastic modulus, wherein the optoelectronic device is in the first region.

According to some example embodiments, a stretchable strain sensor may be configured to have an emission spectrum that changes according to strain variation of a strain on the stretchable strain sensor.

The stretchable strain sensor may include an optoelectronic device, and the optoelectronic device may include a first electrode including a reflective layer, a second electrode facing the first electrode and spaced apart from the reflective layer by an optical path length, and a light emitting layer between the first electrode and the second electrode.

The light emitting layer may be configured to emit white light, and the optoelectronic device may be configured to display a color of a first wavelength spectrum in response to the stretchable strain sensor being elongated at a first elongation rate, may be configured to display a color of a second wavelength spectrum in response to the stretchable strain sensor being elongated at a second elongation rate, the second wavelength spectrum being a shorter wavelength spectrum than the first wavelength spectrum, the second elongation rate higher than the first elongation rate, and may be configured to display a color of a third wavelength spectrum in response to the stretchable strain sensor being elongated at a third elongation rate, the third wavelength spectrum being a shorter wavelength spectrum than the second wavelength spectrum, the third elongation rate higher than the second elongation rate, and the first wavelength spectrum, the second wavelength spectrum, and the third wavelength spectrum may be within a visible wavelength spectrum.

The light emitting layer may be configured to emit light of one wavelength spectrum of a red wavelength spectrum, a green wavelength spectrum, or a blue wavelength spectrum, and the optoelectronic device may be configured to not display a color corresponding to the one wavelength spectrum in response to the stretchable strain sensor being elongated at an elongation rate that is below a threshold elongation rate and may be configured to display the color in response to the stretchable strain sensor being elongated at an elongation rate that is at or above the threshold elongation rate.

The light emitting layer may be configured to emit light of one wavelength spectrum of a red wavelength spectrum, a green wavelength spectrum, or a blue wavelength spectrum, and the optoelectronic device may be configured to display a color corresponding to one wavelength spectrum in response to the stretchable strain sensor being elongated at an elongation rate that is below a threshold elongation rate and may be configured to not display the color in response to the stretchable strain sensor being elongated at an elongation rate that is at or above the threshold elongation rate.

The light emitting layer may be configured to emit light of one wavelength spectrum of a red wavelength spectrum, a green wavelength spectrum, or a blue wavelength spectrum, and the optoelectronic device may be configured to display a color corresponding to one wavelength spectrum in response to the stretchable strain sensor being elongated at an elongation rate that is within a range between a first threshold elongation rate and a second threshold elongation rate and may be configured to not display the color in response to the stretchable strain sensor being elongated at an elongation rate that is outside the range between the first threshold elongation rate and the second threshold elongation rate, so as to be either below the first threshold elongation rate or above the second threshold elongation rate.

According to some example embodiments, a device including the stretchable strain sensor is provided.

As the strain variation according to elongation may be easily recognized, it may be effectively applied to a living body or an object.

DETAILED DESCRIPTION

Figure 1:
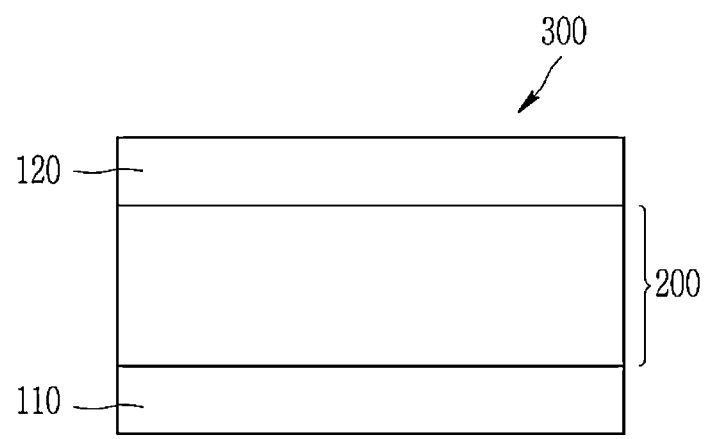
FIG. 1 is a cross-sectional view showing an example of a stretchable strain sensor according to some example embodiments.

Hereinafter, example embodiments are described in detail so that those skilled in the art can easily implement them. However, the actual applied structure may be implemented in various different forms and is not limited to the implementations described herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements and/or spaces present (e.g., the elements are in direct contact with each other).

Hereinafter, "combination" includes a mixture and two or more stacked structures.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, a stretchable strain sensor according to some example embodiments is described with reference to the drawings.

Figure 2:
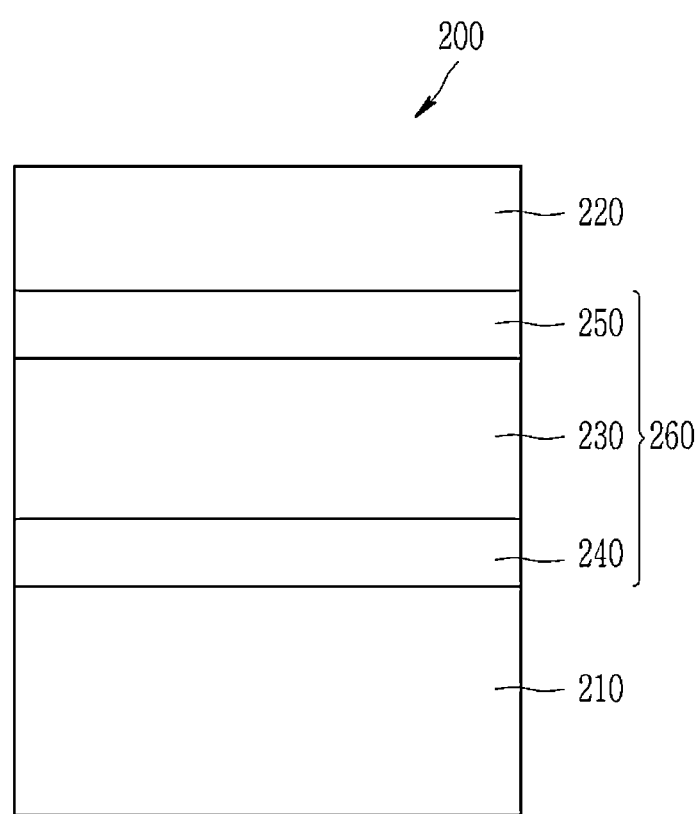
FIG. 2 is a cross-sectional view showing an example of the optoelectronic device of the stretchable strain sensor of FIG. 1.

FIG. 1 is a cross-sectional view showing an example of a stretchable strain sensor according to some example embodiments, and FIG. 2 is a cross-sectional view showing an example of the optoelectronic device of the stretchable strain sensor of FIG. 1.

Referring to FIG. 1, the stretchable strain sensor 300 according to some example embodiments includes a pair of substrates 110 and 120 and an optoelectronic device 200 between the substrates 110 and 120.

The substrates 110 and 120 may be stretchable substrates, and the stretchable substrates may flexibly respond to external forces or external movements such as twisting, pressing, and pulling due to relatively low stiffness and high elongation rate, and may be easily restored to the original state.

The stretchable substrate may include an elastomer. The elastomer may include an organic elastomer, an organic/inorganic elastomer, an inorganic elastomer-like material, or a combination thereof. The organic elastomer or organic/inorganic elastomer may be substituted or unsubstituted polyorganosiloxane such as polydimethylsiloxane (PDMS), or an elastomer including a substituted or unsubstituted butadiene moiety such as styrene-ethylene-butylene-styrene (SEBS), an elastomer including a urethane moiety, an elastomer including an acrylic moiety, an elastomer including an olefin moiety, or a combination thereof, but is not limited thereto. The inorganic elastomer-like material may include an elastic ceramic, a solid metal, a liquid metal, or a combination thereof, but is not limited thereto.

One of the substrates 110 or 120 may be a supporting substrate (e.g., configured to structurally support the optoelectronic device 200) and the other may be a sealing substrate. One or both of the substrates 110 or 120 may be omitted.

The optoelectronic device 200 may be configured to convert an electrical signal into an optical signal or convert an optical signal into an electrical signal, in some example embodiments, a light emitting diode, a photodiode, or a photoelectric conversion device. The light emitting diode may be, in some example embodiments, an organic light emitting diode, a quantum dot light emitting diode, or a perovskite light emitting diode.

Referring to FIG. 2, the optoelectronic device 200 may include a first electrode 210, a second electrode 220, and an optical layer 260 between the first and second electrodes 210 and 220.

One of the first electrode 210 or the second electrode 220 is an anode, and the other is a cathode. In some example embodiments, the first electrode 210 may be an anode and the second electrode 220 may be a cathode. In some example embodiments, the first electrode 210 may be a cathode and the second electrode 220 may be an anode.

The first electrode 210 may be a reflective electrode, and the second electrode 220 may be a semi-transmissive electrode. The reflective electrode may be made of an opaque conductor or may include, in some example embodiments, a reflective layer including an opaque conductor. The reflective electrode may have a light transmittance of less than about 10%, in some example embodiments less than or equal to about 8%, less than or equal to about 7%, less than or equal to about 5%, less than or equal to about 3%, or less than or equal to about 1%. The reflective electrode may have a reflectance of greater than or equal to about 10%, in some example embodiments greater than or equal to about 20%, greater than or equal to about 30%, greater than or equal to about 50%, or greater than or equal to about 70%. The semi-transmissive electrode may have a light transmittance between the transparent electrode and the reflective electrode, and may have a light transmittance of about 10% to about 70%, about 20% to about 60%, or about 30% to about 50%.

At least one of the first electrode 210 or the second electrode 220 may be a stretchable electrode, and in some example embodiments, each of the first electrode 210 and the second electrode 220 may be a stretchable electrode.

The stretchable electrode may include, in some example embodiments, a stretchable conductor or be formed in a stretchable shape. The stretchable conductor may include, in some example embodiments, a liquid metal, a conductive nanostructure, or a combination thereof.

The liquid metal may be an alloy composed of a plurality of metals and/or semimetals, and may exist in a liquid state at room temperature (in some example embodiments, about 25° C.). The liquid metal may be, in some example embodiments, an alloy including at least one selected from copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), indium (In), Aluminum (Al), hafnium (Hf), niobium (Nb), lead (Pb), platinum (Pt), silver (Ag), phosphorus (P), boron (B), silicon (Si), carbon (C), Tin (Sn), molybdenum (Mo), tungsten (W), zinc (Zn), manganese (Mn), erbium (Er), chromium (Cr), praseodymium (Pr), thulium (Tm), and a combination thereof, but is not limited thereto.

The conductive nanostructure may include, in some example embodiments, conductive nanoparticles, conductive nanoflakes, conductive nanowires, conductive nanotubes, or a combination thereof. It may include, in some example embodiments, nanoparticles, nanoflakes, nanowires, nanotubes, or a combination thereof including low-resistance conductors such as silver, gold, copper, and aluminum, or carbon conductors, such as silver nanoparticles, silver nanoflakes, silver nanowires, silver nanotubes, carbon nanotubes, graphene, graphite, or a combination thereof, but is not limited thereto.

The stretchable shape may be, in some example embodiments, a wavy shape, a wrinkle shape, a pop-up shape, or a non-coplanar mesh shape, but is not limited thereto.

In some example embodiments, each of the first electrode 210 and the second electrode 220 may be a stretchable electrode including a liquid metal, wherein the first electrode 210, which is a reflective electrode, may have a sufficient thickness of greater than or equal to about 80 nm and the second electrode 220, which is a semi-transmissive electrode, may have a thickness thinner than that of the reflective electrode, and may have, in some example embodiments, a thickness of about 5 nm to about 50 nm.

The optical layer 260 includes the active layer 230 and optionally auxiliary layers 240 and 250.

The active layer 230 may be, in some example embodiments, a light emitting layer configured to emit light in a particular (or, alternatively, predetermined) wavelength spectrum or an absorbing layer configured to absorb light in a particular (or, alternatively, predetermined) wavelength spectrum. In some example embodiments, the active layer 230 may be a light emitting layer.

The light emitting layer may be configured to emit light of at least a portion of the wavelength spectrum of a visible light wavelength spectrum, in some example embodiments, and may be configured to emit light of at least one of a blue wavelength spectrum, a green wavelength spectrum, or a red wavelength spectrum. The blue wavelength spectrum may, in some example embodiments, have a maximum emission wavelength ($\lambda_{max}$) at greater than or equal to about 400 nm and less than about 500 nm, the green wavelength spectrum may have a maximum emission wavelength ($\lambda_{max}$) at about 500 nm to about 600 nm, and the red wavelength spectrum may have be a maximum emission wavelength ($\lambda_{max}$) at greater than about 600 nm and less than or equal to about 700 nm. As an example, the light emitting layer may be configured to emit light of the blue wavelength spectrum, the green wavelength spectrum, and the red wavelength spectrum, that is, the light of an entire visible wavelength spectrum, in some example embodiments, may be configured to emit white light. The light emitting layer configured to emit white light may be formed by mixing, in some example embodiments, a blue light emitting material, a green light emitting material, and a red light emitting material, or may be formed by stacking a blue light emitting layer, a green light emitting layer, and a red light emitting layer.

The light emitting layer may include an organic light emitting material, an inorganic light emitting material, and/or an organic/inorganic light emitting material. The organic light emitting material may be a low molecular light emitting material and/or a polymer light emitting material and the inorganic light emitting material may be a semiconductor compound, a quantum dot, and/or perovskite, but are not limited thereto.

The organic light-emitting material may include, for example, perylene or a derivative thereof, rubrene or a derivative thereof, 4-(dicyanomethylene)-2-methyl-6-[p-(dimethylamino)styryl]-4H-pyran or a derivative thereof, cumarin or a derivative thereof, carbazole or a derivative thereof, an organometallic compound including Pt, Os, Ti, Zr, Hf, Eu, Tb, Tm, Rh, Ru, Re, Be, Mg, Al, Ca, Mn, Co, Cu, Zn, Ga, Ge, Pd, Ag and/or Au, or a combination thereof. The quantum dot may include, for example, a Group II-VI semiconductor compound, a Group III-V semiconductor compound, a Group IV-VI semiconductor compound, a Group IV semiconductor element or compound, a Group I-III-VI semiconductor compound, a Group I-II-IV-VI semiconductor compound, a Group II-III-V semiconductor compound, or a combination thereof. The Group II-VI semiconductor compound may be for example a binary element of CdSe, CdTe, ZnS, ZnSe, ZnTe, ZnO, HgS, HgSe, HgTe, MgSe, MgS, or a combination thereof; a ternary element of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element of ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof, but is not limited thereto. The Group III-V semiconductor compound may be for example a binary element of GaN, GaP, GaAs, GaSb, AlN, AlP, AlAs, AlSb, InN, InP, InAs, InSb, or a combination thereof; a ternary element of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof, but is not limited thereto. The Group IV-VI semiconductor compound may be for example a binary element of SnS, SnSe, SnTe, PbS, PbSe, PbTe, or a combination thereof; a ternary element of SnSeS, SnSeTe, SnSTe, PbSeS, PbSeTe, PbSTe, SnPbS, SnPbSe, SnPbTe, or a combination thereof; a quaternary element of SnPbSSe, SnPbSeTe, SnPbSTe, or a combination thereof; or a combination thereof, but is not limited thereto. The Group IV semiconductor element or compound may be for example a singular element semiconductor of Si, Ge, or a combination thereof; a binary element semiconductor of SiC, SiGe, or a combination thereof; or a combination thereof, but is not limited thereto. The Group I-III-VI semiconductor compound may be for example selected from $CuInSe_2$, $CuInS_2$, CuInGaSe, CuInGaS, or a combination thereof, but is not limited thereto. The Group I-II-IV-VI semiconductor compound may be for example CuZnSnSe, CuZnSnS, or a combination thereof, but is not limited thereto. The Group II-III-V semiconductor compound may include for example InZnP, but is not limited thereto. The perovskite may include, for example, $CH_3NH_3PbBr_3$, $CH_3NH_3PbI_3$, $CH_3NH_3SnBr_3$, $CH_3NH_3SnI_3$, $CH_3NH_3Sn_{1-x}Pb_xBr_3$, $CH_3NH_3Sn_{1-x}Pb_xI_3$, $HC(NH_2)_2PbI_3$, $HC(NH_2)_2SnI_3$, $(C_4H_9NH_3)_2PbBr_4$, $(C_6H_5CH_2NH_3)_2PbBr_4$, $(C_6H_5CH_2NH_3)_2PbI_4$, $(C_6H_5C_2H_4NH_3)_2PbBr_4$, $(C_6H_{13}NH_3)_2(CH_3NH_3)_{n-1}PbnI_{3n+1}$, or a combination thereof, but is not limited thereto.

The light absorbing layer may be configured to absorb light of at least a portion of the wavelength spectrum of a visible light wavelength spectrum, in some example embodiments, and may be configured to absorb light of at least one of a blue wavelength spectrum, a green wavelength spectrum, or a red wavelength spectrum. The blue wavelength spectrum may, in some example embodiments, have a maximum absorption wavelength ($\lambda_{max}$) at greater than or equal to about 400 nm and less than about 500 nm, the green wavelength spectrum may have a maximum absorption wavelength ($\lambda_{max}$) at about 500 nm to about 600 nm, and the red wavelength spectrum may have be a maximum absorption wavelength ($\lambda_{max}$) at greater than about 600 nm and less than or equal to about 700 nm. As an example, the light absorbing layer may be configured to absorb light of the blue wavelength spectrum, the green wavelength spectrum, and the red wavelength spectrum, that is, the light of an entire visible wavelength spectrum, in some example embodiments, may be configured to absorb white light. The light absorbing layer configured to absorb white light may be formed by mixing, in some example embodiments, a blue light absorbing material, a green light absorbing material, and a red light absorbing material, or by stacking a blue light absorbing layer, a green light absorbing layer, and a red light absorbing layer.

The light absorbing layer may include an organic light absorbing material, an inorganic light absorbing material, and/or an organic/inorganic light absorbing material. The organic light absorbing material may be a low molecular weight absorbing material and/or a polymer light absorbing material and the inorganic light absorbing material may be a semiconductor compound, a quantum dot, and/or a perovskite, but are not limited thereto. As an example, the light absorbing layer may include, for example, Si, GaN, AlGaN, GaAsP, metal phthalocyanine, rubrene, pentacene, fullerene, thiophene, quinoid, a derivative thereof, or a combination thereof, but is not limited thereto.

The active layer 230 may be a stretchable active layer. The stretchable active layer may be stretched in a particular (or, alternatively, predetermined) direction without physically, electrically and/or optically substantial damage and/or cracking. In some example embodiments, the stretchable active layer may have an elongation rate of greater than or equal to about 2%, greater than or equal to about 3%, greater than or equal to about 5%, greater than or equal to about 10%, greater than or equal to about 15%, greater than or equal to about 20%, about 2% to about 300%, about 3% to about 300%, about 5% to about 300%, about 10% to about 300%, about 15% to about 300%, about 20% to about 300%, about 2% to about 200%, about 3% to about 200%, about 5% to about 200%, about 10% to about 200%, about 15% to about 200%, about 20% to about 200%, about 2% to about 100%, about 3% to about 100%, about 5% to about 100%, about 10% to about 100%, about 15% to about 100%, about 20% to about 100%, about 2% to about 70%, about 3% to about 70%, about 5% to about 70%, about 10% to about 70%, about 15% to about 70% or about 20% to about 70%. Herein, the elongation rate may be a percentage of a length change that is increased to a breaking point with respect to the initial length.

The stretchable active layer may include a stretchable organic light emitting material, a stretchable inorganic light emitting material, a stretchable organic/inorganic light emitting material, a stretchable organic light absorbing material, a stretchable inorganic light absorbing material, and/or a stretchable organic/inorganic light absorbing material. The aforementioned organic light emitting material, inorganic light emitting material, organic/inorganic light emitting material, organic light absorbing material, inorganic light absorbing material, and/or organic/inorganic light absorbing material may be formed by mixing with an elastomer. The elastomer may include, in some example embodiments, an organic elastomer, an organic/inorganic elastomer, an inorganic elastomer-like material, or a combination thereof. The elastomer may include, in some example embodiments a substituted or unsubstituted polyorganosiloxane such as polydimethylsiloxane (PDMS), an elastomer including a substituted or unsubstituted butadiene moiety such as styrene-ethylene-butylene-styrene (SEBS), an elastomer including a urethane moiety, an elastomer including an acrylic moiety, an elastomer including an olefin moiety, or a combination thereof, elastic ceramics, elastic solid metals, elastic liquid metals, or a combination thereof, but is not limited thereto. In some example embodiments, the elastomer included in a stretchable active layer may be the same as or different from the elastomer included in the substrates 110 and 120.

The auxiliary layers 240 and 250 are disposed between the first electrode 210 and the active layer 230 and/or between the second electrode 220 and the active layer 230 to improve the electro-optical properties of the optoelectronic device 200. In some example embodiments, the auxiliary layers 240 and 250 may be a hole transport layer, a hole injection layer, an electron blocking layer, an electron transport layer, an electron injection layer, a hole blocking layer, and/or an optical functional layer, but are not limited thereto.

The auxiliary layers 240 and 250 may be stretched auxiliary layers. The stretchable auxiliary layer may be stretched in a particular (or, alternatively, predetermined) direction without physically, electrically and/or optically substantial damage and/or cracking. In some example embodiments, the stretchable auxiliary layer may have an elongation rate of greater than or equal to about 2%, greater than or equal to about 3%, greater than or equal to greater than or equal to about 5%, greater than or equal to about 10%, greater than or equal to about 15%, greater than or equal to about 20%, about 2% to about 300%, about 3% to about 300%, about 5% to about 300%, about 10% to about 300%, about 15% to about 300%, about 20% to about 300%, about 2% to about 200%, about 3% to about 200%, about 5% to about 200%, about 10% to about 200%, about 15% to about 200%, about 20% to about 200%, about 2% to about 100%, about 3% to about 100%, about 5% to about 100%, about 10% to about 100%, about 15% to about 100%, about 20% to about 100%, about 2% to about 70%, about 3% to about 70%, about 5% to about 70%, about 10% to about 70%, about 15% to about 70%, or about 20% to about 70%.

The stretchable auxiliary layer may include, in some example embodiments, a stretchable organic material, a stretchable inorganic material, and/or a stretchable organic/inorganic material, or may be formed by mixing an organic material, an inorganic material, and/or an organic/inorganic material with an elastomer. The elastomer is the same as described above. In some example embodiments, the elastomer included in the stretchable auxiliary layer may be the same as or different from the elastomer included in the stretchable active layer. In some example embodiments, the elastomer included in the stretchable auxiliary layer may be the same as or different from the elastomer included in the substrates 110 and 120.

The auxiliary layers 240 and 250 may include, in some example embodiments, at least one of poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, ethoxylated polyethyleneimine (PEIE), poly[(9,9-bis(3'-(N,N-dimethylamino)propyl)-2,7-fluorene)-alt-2,7-(9,9-dioctylfluorene)] (PFN), N,N,N',N'-tetrakis(4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), P-type metal oxide (e.g., $NiO$, $WO_3$, $MoO_3$, etc.), a carbon-based material such as graphene oxide, or any combination thereof, but is not limited thereto.

At least one of the auxiliary layers 240 or 250 may be omitted.

A plurality of signal lines and switching and/or driving elements electrically connected to the signal lines may be further included between the substrate 110 and the optoelectronic device 200. The switching and/or driving element may be, in some example embodiments, a thin film transistor. The plurality of signal lines may include a gate line configured to transmit a gate signal (or scan signal), a data line configured to transmit a data signal, and a driving voltage line configured to transmit a driving voltage. At least a portion of the plurality of signal lines may be stretchable wires.

The thin film transistor may include, in some example embodiments, a switching thin film transistor and/or a driving thin film transistor. The switching thin film transistor is electrically connected to the gate line and the data line and may include a first gate electrode connected to the gate line; a first source electrode connected to the data line; a first drain electrode facing the first source electrode; and a first semiconductor electrically connected to the first source electrode and the first drain electrode, respectively. The driving thin film transistor may include a second gate electrode electrically connected to the first drain electrode; a second source electrode connected to the driving voltage line; a second drain electrode facing the second source electrode; a second semiconductor electrically connected to the second source electrode and the second drain electrode, respectively. In some example embodiments, the first semiconductor and the second semiconductor may each include a semiconductor material and an elastomer. In some example embodiments, the first semiconductor and the second semiconductor may each include an organic semiconductor material and an elastomer. The elastomer is as described above.

In some example embodiments, the aforementioned substrates 110 and 120 and the optoelectronic device 200 may have each stretchability and may have, in some example embodiments, an elongation rate of greater than or equal to about 2%, greater than or equal to about 3%, greater than or equal to about 5%, greater than or equal to about 10%, greater than or equal to about 15%, greater than or equal to about 20%, about 2% to about 300%, about 3% to about 300%, about 5% to about 300%, about 10% to about 300%, about 15% to about 300%, about 20% to about 300%, about 2% to about 200%, about 3% to about 200%, about 5% to about 200%, about 10% to about 200%, about 15% to about 200%, about 20% to about 200%, about 2% to about 100%, about 3% to about 100%, about 5% to about 100%, about 10% to about 100%, about 15% to about 100%, about 20% to about 100%, about 2% to about 70%, about 3% to about 70%, about 5% to about 70%, about 10% to about 70%, about 15% to about 70%, or about 20% to about 70%. Accordingly, the stretchable strain sensor 300 may not suffer physical, electrical, and/or optical damage by repeated elongation.

In some example embodiments, the stretchable strain sensor 300 may be configured to display strain variation applied by the elongation as colors. The colors may be determined from an emission spectrum or absorption spectrum of the optoelectronic device 200, in some example embodiments, from change of the emission spectrum or absorption spectrum due to the strain variation due to an elongation rate or elongation. Accordingly, the stretchable strain sensor 300 may be configured to have an emission spectrum that changes according to strain variation of a strain on the stretchable strain sensor.

In some example embodiments, the stretchable strain sensor 300, as described above, includes the optoelectronic device 200 including a reflective electrode, a semi-transmissive electrode, and an optical layer 260 therebetween and thus may form a microcavity structure. The microcavity structure may make light emitted from inside of the optoelectronic device 200 repetitively reflected between the reflective electrode and the semi-transmissive electrode separated by a particular (or, alternatively, predetermined) optical path length and thus intensify light of a particular (or, alternatively, predetermined) wavelength spectrum but weaken light of the other wavelength spectra and, so that the light of the particular (or, alternatively, predetermined) wavelength spectrum may escape outside. In some example embodiments, the light emitted from a light emitting layer is repetitively reflected between the reflective electrode and the semi-transmissive electrode and thus modified, and light of a wavelength spectrum corresponding to a resonance wavelength of the microcavity out of the modified light is intensified and emitted through the semi-transmissive electrode, while light of the other wavelength spectra may be suppressed or quenched.

The colors displayed in the stretchable strain sensor 300 may relate to the resonance wavelength of the microcavity. In other words, the stretchable strain sensor 300 may be configured to display a color corresponding to a wavelength spectrum, where the wavelength spectrum of light emitted from inside of the optoelectronic device 200, that is, the light emitting layer is overlapped with a wavelength spectrum corresponding to the resonance wavelength of the microcavity. In some example embodiments, the light emitted from the inside of the optoelectronic device 200 may be the entire visible wavelength spectrum, and the color displayed in the stretchable strain sensor 300 may be a part of wavelength spectra out of the visible light spectrum.

In some example embodiments, the active layer (light emitting layer) 230 of the optoelectronic device 200 may be configured to emit light of the entire visible wavelength spectrum, that is, white light, and when the resonance wavelength of the microcavity belongs to a blue wavelength spectrum, the stretchable strain sensor 300 may be configured to display blue.

In some example embodiments, when the active layer (light emitting layer) 230 of the optoelectronic device 200 is configured to emit light of the entire visible wavelength spectrum, that is, white light, and when the resonance wavelength of the microcavity belongs to a green wavelength spectrum, the stretchable strain sensor 300 may be configured to display green.

In some example embodiments, when the active layer (light emitting layer) 230 of the optoelectronic device 200 is configured to emit light of the entire visible wavelength spectrum, that is, white light, and when the resonance wavelength of the microcavity belongs to a red wavelength spectrum, the stretchable strain sensor 300 may be configured to display red.

The resonance wavelength of the microcavity may relate to an optical path length, and the optical path length may be a gap (e.g., distance) between the reflective electrode and the semi-transmissive electrode, in some example embodiments, when the reflective electrode includes a reflective layer, the optical path length may be a gap between the reflective layer of the reflective electrode and the semi-transmissive electrode. In some example embodiments, in FIG. 2, when the first electrode 210 is the reflective electrode, and the second electrode 220 is the semi-transmissive electrode spaced apart from the reflective electrode by the optical path length, the optical path length may be substantially the same as a thickness of the optical layer 260.

In some example embodiments, as described above, since the active layer 230 and the auxiliary layers 240 and 250 may be respectively a stretchable active layer and a stretchable auxiliary layer, the thickness of the optical layer 260 may be changed according to elongation in a particular (or, alternatively, predetermined) direction (referred to herein as an elongation direction, shown in FIGS. 3, 5, 7, and 9 as the X direction, which may be perpendicular to the thickness direction that is the direction of the thickness of the optoelectronic device 200, shown in FIGS. 3, 5, 7, and 9 as the Y direction), and accordingly, the optical path length also may be changed according to the elongation in the particular (or, alternatively, predetermined) direction (e.g., X direction). In some example embodiments, when the stretchable strain sensor 300 is elongated in the particular (or, alternatively, predetermined) direction, as an elongation rate (e.g., a rate, or magnitude, of the elongation of the stretchable strain sensor 300 in the elongation direction) is increased, the thickness of the optical layer 260 is decreased, and the optical path length also may be shortened. A thickness decrease rate of the optical layer 260 may vary depending on a material, an elastic modulus, and the thickness thereof and the like, and in some example embodiments, when the elongation rate is in a range of about 5% to about 100%, the thickness decrease rate may be about 5% to about 90%. Herein, the thickness decrease rate may be a percentage of a thickness change with respect to an initial thickness.

As this optical path length decreases, a wavelength spectrum of light intensified at the microcavity structure may be changed, in some example embodiments, the resonance wavelength may be shifted to a short wavelength spectrum according to the elongation. In this way, as the thickness of the optical layer 260, and thus the thickness of the stretchable strain sensor, is changed (in the thickness direction extending parallel to said thickness, e.g., the Y direction) due to the elongation (e.g., in the elongation direction (e.g., X direction) that is perpendicular to the thickness direction (e.g., Y direction)), the stretchable strain sensor 300 may exhibit wavelength selectivity, and as the thickness of the optical layer 260 is changed due to the elongation, the stretchable strain sensor 300 (e.g., the optoelectronic device 200) may be configured to display a color of a wavelength spectrum corresponding to the optical path length changed depending on the thickness of the optical layer 260. Thus, the optoelectronic device 200 may be configured to display one or more colors according to the thickness change of the thickness of the optical layer 260, and thus the thickness of the stretchable strain sensor, in the thickness direction (e.g., Y direction) due to elongation of the stretchable strain sensor in the elongation direction (e.g., X direction).

Figure 3:
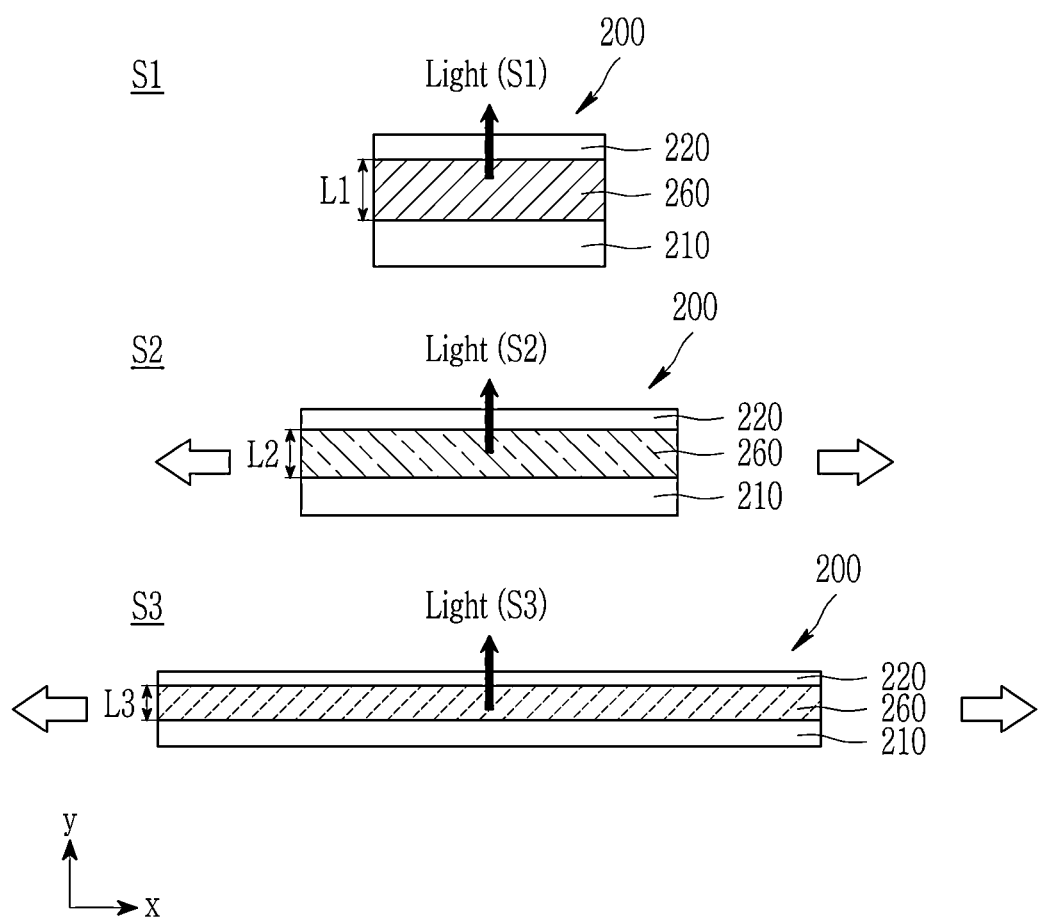
FIG. 3 is a schematic view showing an example of elongation of the stretchable strain sensor according to some example embodiments.
Figure 4:
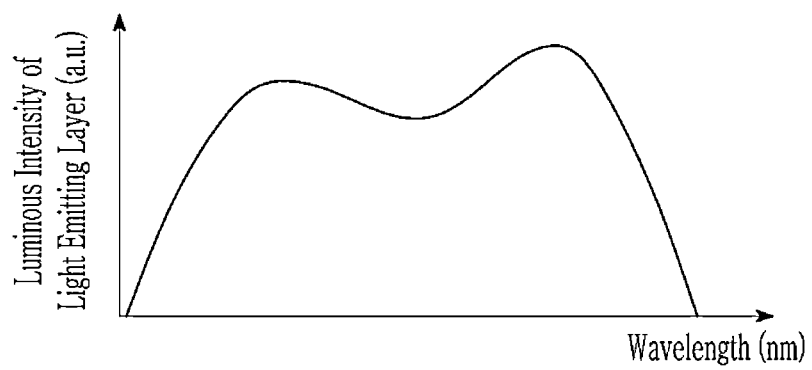
FIG. 4 is a schematic view showing an example of a change in the emission spectrum according to elongation of the stretchable strain sensor of FIG. 3.
Figure 4:
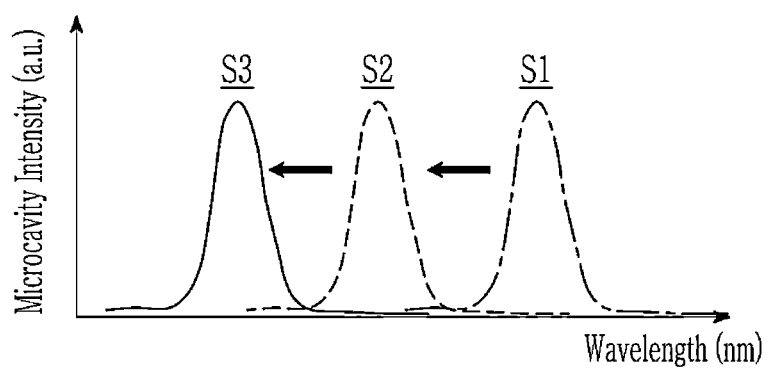
Figure 4:
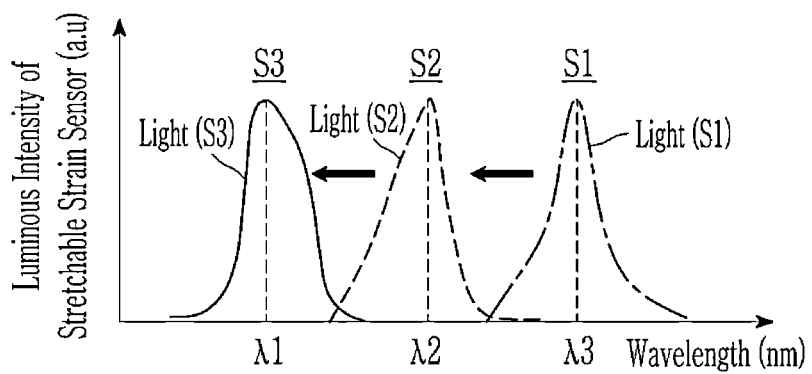

FIG. 3 is a schematic view showing an example of elongation of the stretchable strain sensor according to some example embodiments, and FIG. 4 is a schematic view showing an example of a change in the emission spectrum according to elongation of the stretchable strain sensor of FIG. 3.

Referring to FIGS. 3 and 4, the optoelectronic device 200 may include, in some example embodiments, a light emitting layer (a white light emitting layer) configured to emit light of the entire visible wavelength spectrum (e.g., configured to emit white light) and in a non-stretched state or an initial stretched state (a first elongation rate (51)), display a first color corresponding to a first wavelength spectrum having a first maximum emission wavelength ($\lambda_1$) due to the microcavity (e.g., in response to the stretchable strain sensor 300 being elongated in the elongation direction (e.g., the X direction as shown in FIG. 3) at a first elongation rate S1).

Subsequently, when the stretchable strain sensor 300 is elongated at a second elongation rate (S2) higher than the first elongation rate (S1), as the optical path length (e.g., in the Y direction) is decreased (from L1 to L2), the wavelength spectrum of light intensified in the microcavity structure is changed, and thus the optoelectronic device 200 may, in response to the stretchable strain sensor 300 being elongated in the elongation direction (e.g., X direction) at the second elongation rate S2, display a second color corresponding to a second wavelength spectrum having a second maximum emission wavelength ($\lambda_2$).

Subsequently, when the stretchable strain sensor 300 is much elongated (e.g., tin the X direction) at a third elongation rate (S3) higher than the second elongation rate (S2), as the optical path length (e.g., in the Y direction) is additionally decreased (from L2 to L3) due to the elongation, the wavelength spectrum of light intensified in the microcavity structure is changed, the optoelectronic device 200 may, in response to the stretchable strain sensor 300 being elongated in the elongation direction (e.g., in the X direction) at the third elongation rate S3, display a third color corresponding to a third wavelength spectrum having a third maximum emission wavelength ($\lambda_3$). Herein, the first elongation rate (S1), the second elongation rate (S2), and the third elongation rate (S3) satisfy S1<S2<S3 and, in some example embodiments, may be respectively in a range of about 0 to about 100%. The first, second, and third wavelength spectra may be within a visible wavelength spectrum.

In this way, as the elongation rate of the stretchable strain sensor 300 is larger, the optical path length of the microcavity structure (e.g., in the Y direction) may be shorter, and the optoelectronic device 200 may be configured to display colors of wavelength spectra corresponding to optical path lengths depending on a change of the optical path length.

In some example embodiments, as the elongation rate of the stretchable strain sensor 300 is larger, the wavelength spectrum of light intensified in the microcavity structure may be shifted toward the short wavelength, and as shown in FIG. 4, the emission spectrum having the second maximum emission wavelength ($\lambda_2$) (e.g., the second wavelength spectrum) may be a shorter wavelength spectrum than the emission spectrum having the first maximum emission wavelength ($\lambda_1$) (e.g., the first wavelength spectrum), the emission spectrum having the third maximum emission wavelength ($\lambda_3$) (e.g., the third wavelength spectrum) may be a shorter wavelength spectrum than the emission spectrum having the second maximum emission wavelength ($\lambda_2$).

Figure 5:
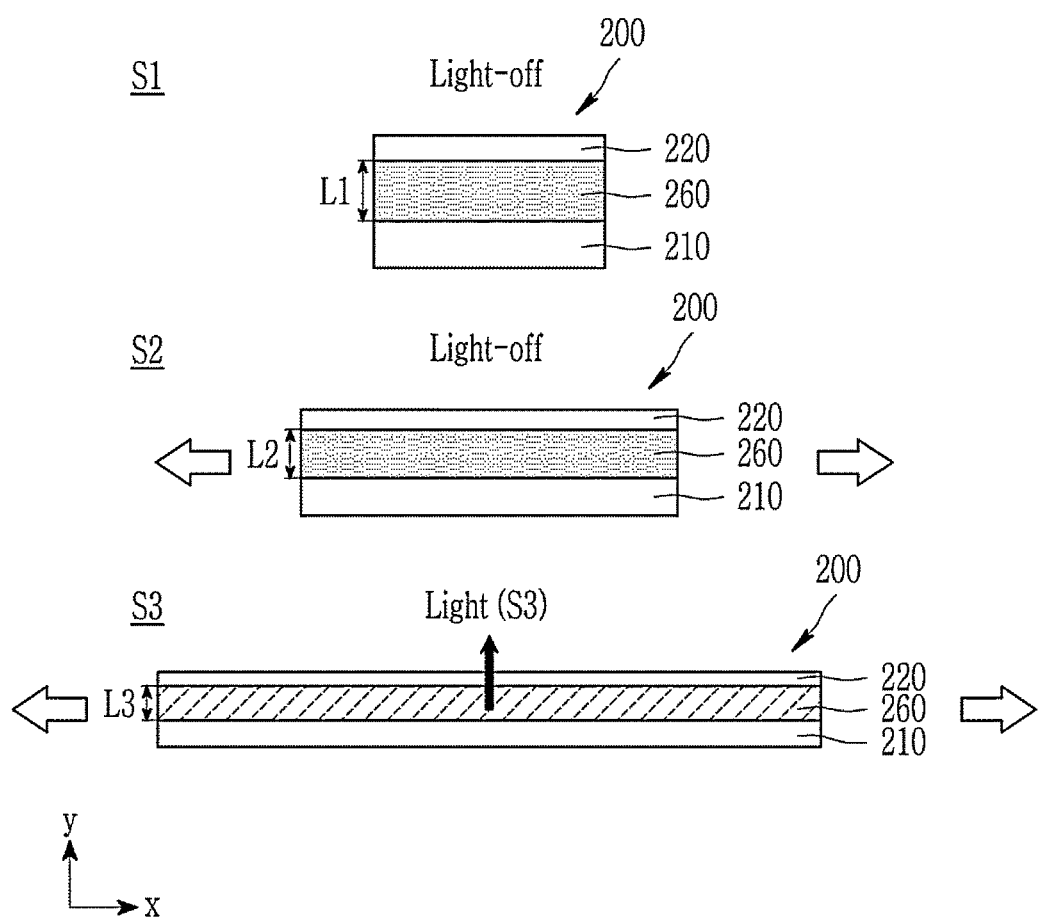
FIG. 5 is a schematic view showing an example of elongation of a stretchable strain sensor according to some example embodiments.
Figure 6:
FIG. 6 is a schematic view showing an example of a change in the emission spectrum according to elongation of the stretchable strain sensor of FIG. 5.
Figure 6:
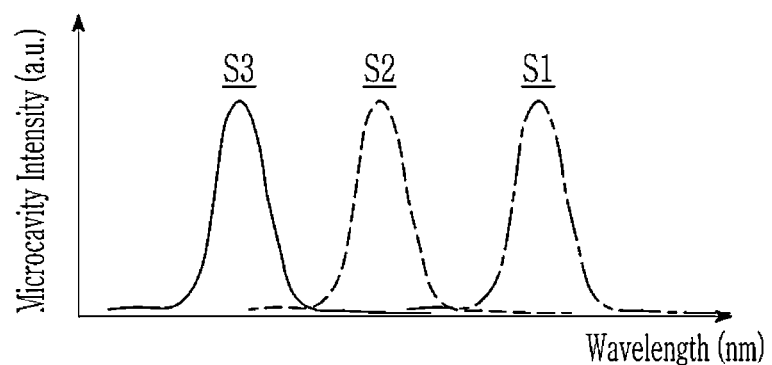
Figure 6:
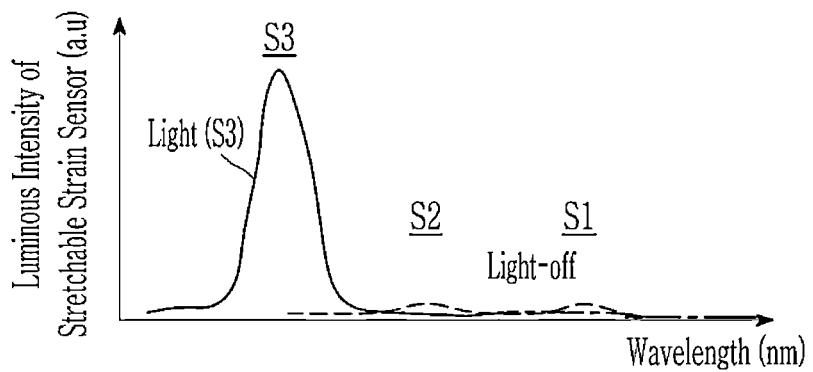

FIG. 5 is a schematic view showing an example of elongation of a stretchable strain sensor according to some example embodiments, and FIG. 6 is a schematic view showing an example of a change in the emission spectrum according to elongation of the stretchable strain sensor of FIG. 5.

As described above, the color displayed in the stretchable strain sensor 300 is related to the resonance wavelength of the microcavity, and specifically, the stretchable strain sensor 300 may be configured to display a color corresponding to a wavelength spectrum where the wavelength spectrum emitted from inside of the optoelectronic device 200 is overlapped with the resonance wavelength of the microcavity. This may mean that when the wavelength spectrum emitted from the inside of the optoelectronic device 200 is not overlapped with the wavelength spectrum corresponding to the resonance wavelength of the microcavity, the color may not be displayed.

Referring to FIGS. 5 and 6, the optoelectronic device 200 includes, in some example embodiments, a light emitting layer (red light emitting layer, green light emitting layer, or blue light emitting layer) configured to emit light of a portion of a wavelength spectrum belonging to a visible light wavelength spectrum, in some example embodiments, one wavelength spectrum of a red wavelength spectrum, a green wavelength spectrum, or a blue wavelength spectrum, while in a non-stretched state or an initial stretched state (first elongation (S1)), a wavelength spectrum corresponding to the resonance wavelength of microcavity may not be overlapped with the wavelength spectrum of the light emitting layer. In this case, since the wavelength spectrum emitted from the light emitting layer does not escape through the semi-transmissive electrode, the stretchable strain sensor 300 may not display a color, for example, black (Light-off).

It will be understood that, in some example embodiments, displaying a color may encompass displaying a particular color (e.g., displaying a particular color corresponding to a particular portion of the visible wavelength spectrum). In some example embodiments, displaying a color may encompass displaying all colors (e.g., displaying a combination of all colors corresponding to the entire visible wavelength spectrum), which may include "displaying" a white color or white appearance, where white refers to light of the entire visible wavelength spectrum. Thus, by displaying all colors, the stretchable strain sensor may appear to be displaying a white color, and this will be understood to encompass displaying all colors.

It will be understood that, in some example embodiments, not displaying a color may encompass not displaying a particular color (e.g., not displaying a particular color corresponding to a particular portion of the visible wavelength spectrum). In some example embodiments, not displaying a color may encompass not displaying any color (e.g., not displaying any color corresponding to any portion of the visible wavelength spectrum), which may include "displaying" a black color or black appearance, where black refers to an absence or substantial absence of light of any wavelength in the visible wavelength spectrum. Thus, by not displaying any color, the stretchable strain sensor may appear to be displaying a black color, and this will be understood to encompass not displaying any color.

Subsequently, when the stretchable strain sensor 300 is elongated (e.g., in the X direction as shown in FIGS. 5-6) at the second elongation rate (S2) higher than the first elongation rate (S1), as the optical path length (e.g., in the Y direction as shown in FIGS. 5-6) is decreased (from L1 to L2) due to the elongation, a wavelength spectrum of light intensified in the microcavity structure is changed and thus shifted to the short wavelength spectrum, but when the second elongation rate (S2) is smaller than the threshold elongation rate, the wavelength spectrum corresponding to the resonance wavelength of the microcavity is still not overlapped with the wavelength spectrum of the light emitting layer and thus the optoelectronic device 200 may not display a color (Light-off) in response to the stretchable strain sensor 300 being elongated in the elongation direction (e.g., X direction) at second elongation rate (S2) that is below the threshold elongation rate.

Subsequently, when the stretchable strain sensor 300 is elongated (e.g., in the X direction) at the third elongation rate (S3) higher than the second elongation rate (S2), the optical path length (e.g., in the Y direction) is additionally decreased (from L2 to L3) due to the elongation, the wavelength spectrum of light intensified in the microcavity structure may be further shifted toward the short wavelength spectrum, and when the third elongation rate (S3) is larger than (e.g., at or above) the threshold elongation rate, the wavelength spectrum corresponding to the resonance wavelength of the microcavity may be overlapped with the wavelength spectrum of the light emitting layer, and a color corresponding to at least the overlapped wavelength spectrum may be displayed in response to the stretchable strain sensor 300 being elongated (e.g., in the X direction) at the third elongation rate (S3) that is at or above a threshold elongation rate. Herein, the threshold elongation rate may be an elongation rate where the stretchable strain sensor 300 displays a color (Light-on) and, in some example embodiments, larger than the second elongation rate (S2) and smaller than or equal to the third elongation rate (S3).

In this way, the stretchable strain sensor 300 according to some example embodiments may or may not display a color (e.g., the color that the light emitting layer of the optoelectronic device is configured to emit, but example embodiments are not limited thereto) based on the threshold elongation rate, and accordingly, when the strain is greater than or equal to a particular (or, alternatively, predetermined) value, the stretchable strain sensor 300 may be applied as a sensor displaying a color by light emission and so on. For example, where the light emitting layer is configured to emit light of one wavelength spectrum of a red wavelength spectrum, a green wavelength spectrum, or a blue wavelength spectrum, the optoelectronic device 200 may be configured to not display a color corresponding to the one wavelength spectrum (e.g., not display any color) in response to the stretchable strain sensor 300 being elongated in the elongation direction at an elongation rate that is below a threshold elongation rate, and the optoelectronic device 200 may be configured to display the color in response to the stretchable strain sensor 300 being elongated in the elongation direction at an elongation rate that is at or above the threshold elongation rate.

It will be understood that, in some example embodiments the light emitting layer is configured to emit light of a wide wavelength spectrum that encompasses some or all of the visible wavelength spectrum (e.g., the light emitting layer is configured to emit light that includes a combination of two or more, or all, of a red wavelength spectrum, a green wavelength spectrum, and a blue wavelength spectrum). The optoelectronic device 200 may be configured to not display some or any colors corresponding to the wide wavelength spectrum (e.g., the optoelectronic device 200 may display a red color or display black) in response to the stretchable strain sensor 300 being elongated in the elongation direction at an elongation rate that is below a threshold elongation rate, such that one or more colors corresponding to at least a limited portion of the wide wavelength spectrum are not displayed (or no colors are displayed at all, such that a black appearance is displayed). The optoelectronic device 200 may be further configured to display a color corresponding to the entire wide wavelength spectrum (e.g., white light) or a limited portion of the wide wavelength spectrum (e.g., blue, green, or a combination thereof such as cyan) in response to the stretchable strain sensor 300 being elongated in the elongation direction at an elongation rate that is at or above the threshold elongation rate.

Figure 7:
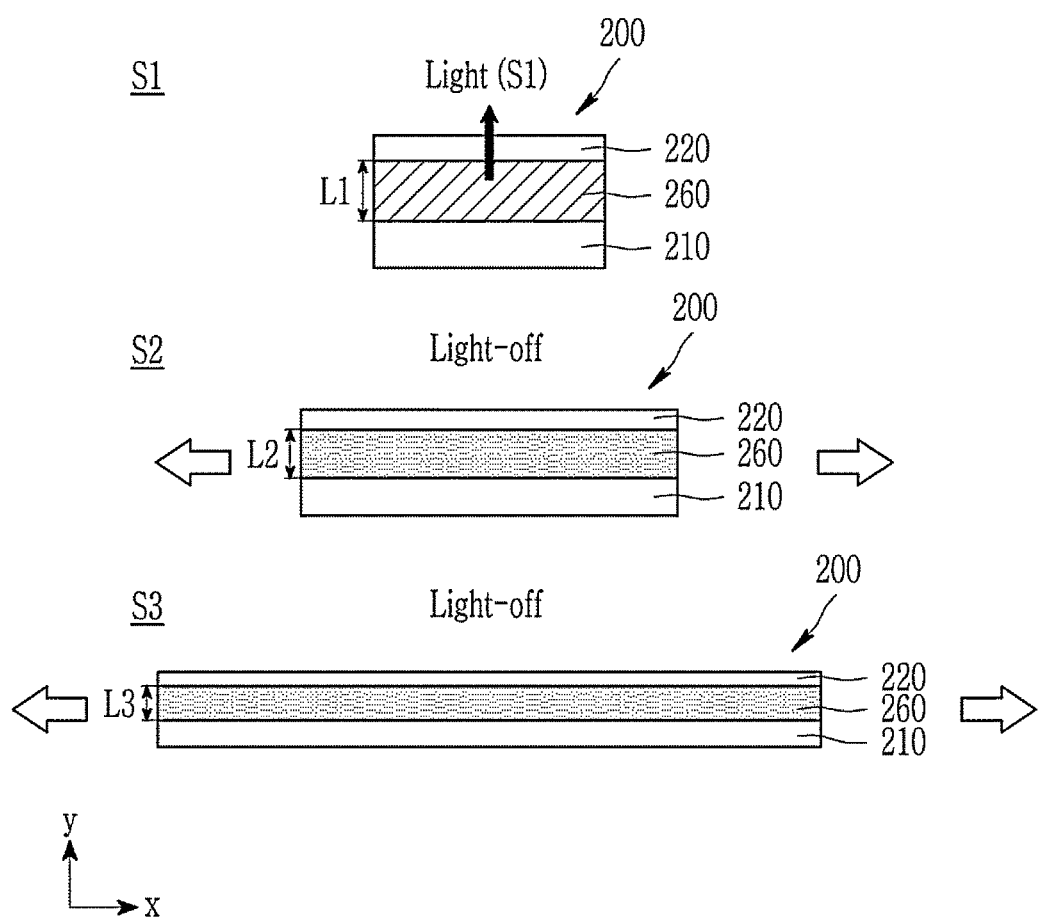
FIG. 7 is a schematic diagram showing an example of elongation of a stretchable strain sensor according to some example embodiments.
Figure 8:
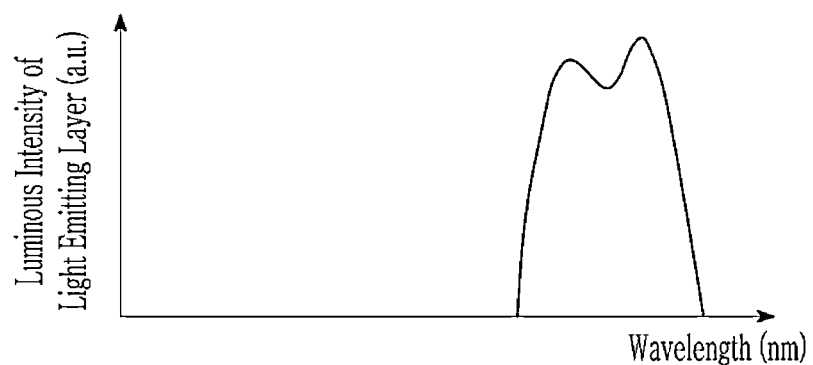
FIG. 8 is a schematic view showing an example of a change in the emission spectrum according to elongation of the stretchable strain sensor of FIG. 7.
Figure 8:
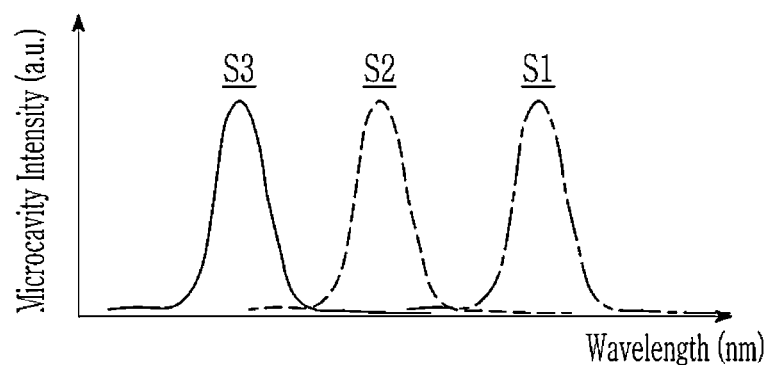
Figure 8:
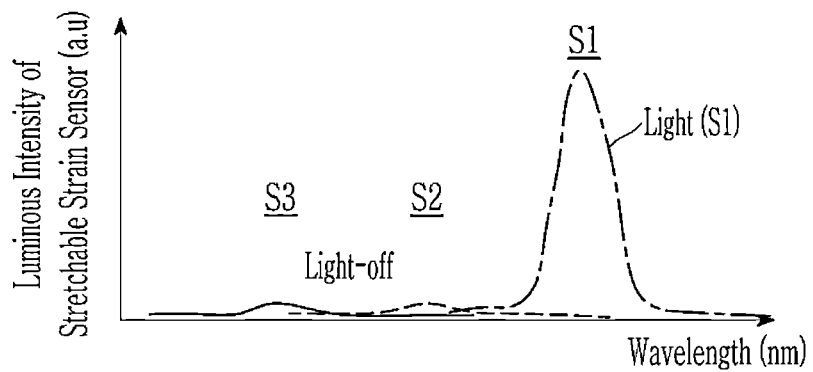

FIG. 7 is a schematic diagram showing an example of elongation of a stretchable strain sensor according to some example embodiments, and FIG. 8 is a schematic view showing an example of a change in the emission spectrum according to elongation of the stretchable strain sensor of FIG. 7.

Referring to FIGS. 7 and 8, the optoelectronic device 200 includes, in some example embodiments, a light emitting layer (red light emitting layer, green light emitting layer, or blue light emitting layer) configured to emit light of a portion of a wavelength spectrum belonging to a visible light wavelength spectrum, in some example embodiments, one of a red wavelength spectrum, a green wavelength spectrum, or a blue wavelength spectrum, and in a non-stretched state or an initial stretched state (first elongation (S1)), a wavelength spectrum corresponding to the resonance wavelength of microcavity may be overlapped with the wavelength spectrum of the light emitting layer. Accordingly, the stretchable strain sensor 300 may be configured to display a color corresponding to one or more wavelength spectra (e.g., a wavelength spectrum overlapped at the first elongation (S1)), in response to the stretchable strain sensor 300 being elongated in the elongation direction (e.g., X direction) at an elongation rate (S1) that is below a threshold elongation rate (Light-on).

Subsequently, the stretchable strain sensor 300 is respectively elongated at the second and third elongation rates (S2 and S3) higher than the first elongation rate (S1), as the optical path length is decreased (from L1 to L2, from L2 to L3) due to the elongations, the wavelength spectrum of light intensified in the microcavity structure is changed and thus shifted to the short wavelength spectrum, and the shifted wavelength spectrum may not be overlapped with the wavelength spectrum of the light emitting layer and thus not display a color (Light-off). Herein, the threshold elongation rate may be an elongation rate where the stretchable strain sensor 300 displays no color and, in some example embodiments, larger than the first elongation rate (S1) and smaller than or equal to the second elongation rate (S2). Accordingly, the optoelectronic device 200 may not display a color (e.g., may not display any color, for example display a black appearance) in response to the stretchable strain sensor 300 being elongated in the elongation direction at an elongation rate that is at or above the threshold elongation rate.

Accordingly, the stretchable strain sensor 300 according to some example embodiments may or may not display a color (e.g., may not display any color, for example display a black appearance) based on the threshold elongation rate and accordingly, may be applied as a sensor displaying the color, when the strain is less than a particular (or, alternatively, predetermined) value, but not displaying the color, when the strain is greater than or equal to the particular (or, alternatively, predetermined) value. For example, where the light emitting layer is configured to emit light of one wavelength spectrum of a red wavelength spectrum, a green wavelength spectrum, or a blue wavelength spectrum, the optoelectronic device 200 may be configured to display a color corresponding to the one wavelength spectrum in response to the stretchable strain sensor 300 being elongated in the elongation direction at an elongation rate that is below a threshold elongation rate, and the optoelectronic device 200 may be configured to not display the color (e.g., may not display any color, for example display a black appearance) in response to the stretchable strain sensor 300 being elongated in the elongation direction at an elongation rate that is at or above the threshold elongation rate.

It will be understood that, in some example embodiments the light emitting layer is configured to emit light of a wide wavelength spectrum that encompasses some or all of the visible wavelength spectrum (e.g., the light emitting layer is configured to emit light that includes a combination of two or more, or all, of a red wavelength spectrum, a green wavelength spectrum, and a blue wavelength spectrum). The optoelectronic device 200 may be further configured to display a color corresponding to the entire wide wavelength spectrum (e.g., white light) or a limited portion of the wide wavelength spectrum (e.g., blue, green, or a combination thereof such as cyan) in response to the stretchable strain sensor 300 being elongated in the elongation direction at an elongation rate that is below a threshold elongation rate. The optoelectronic device 200 may be configured to not display some or any colors corresponding to the wide wavelength spectrum (e.g., the optoelectronic device 200 may display a red color or display black) in response to the stretchable strain sensor 300 being elongated in the elongation direction at an elongation rate that is at or above the threshold elongation rate, such that one or more colors corresponding to at least a limited portion of the wide wavelength spectrum are not displayed (or no colors are displayed at all, such that a black appearance is displayed).

Figure 9:
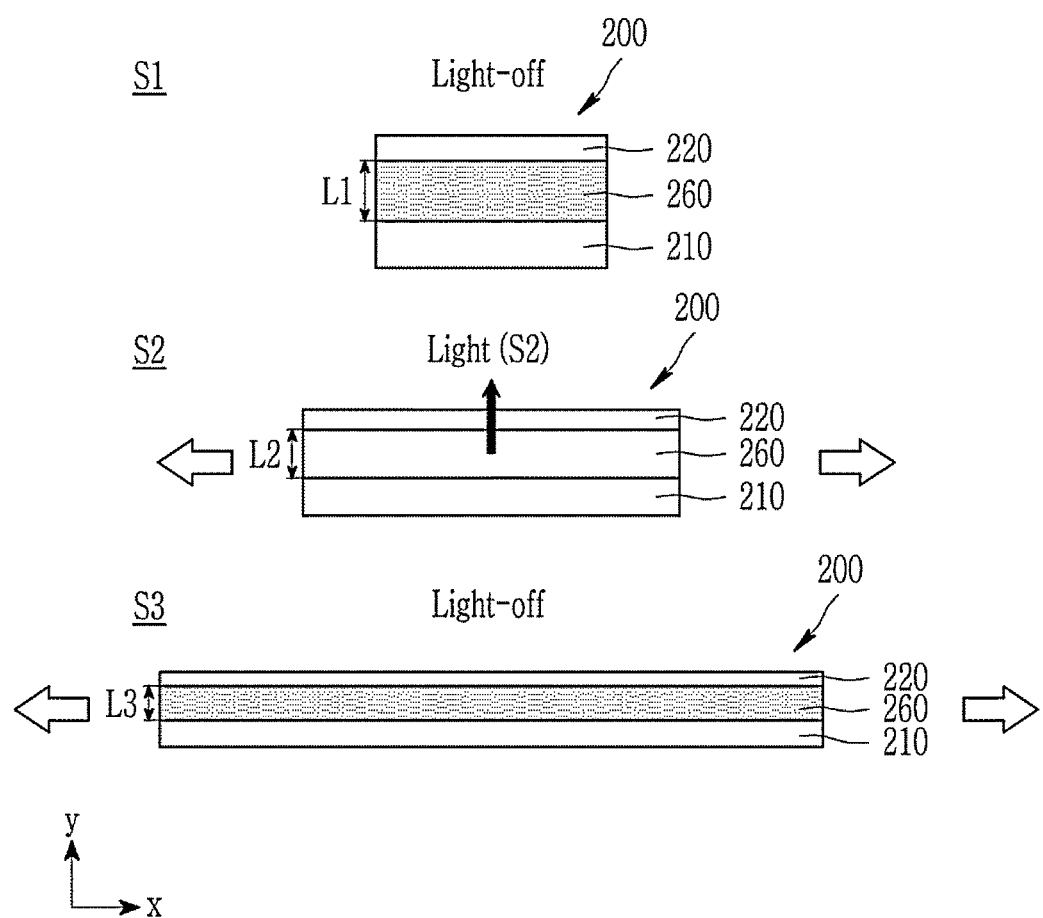
FIG. 9 is a schematic view showing an example of elongation of a stretchable strain sensor according to some example embodiments.
Figure 10:
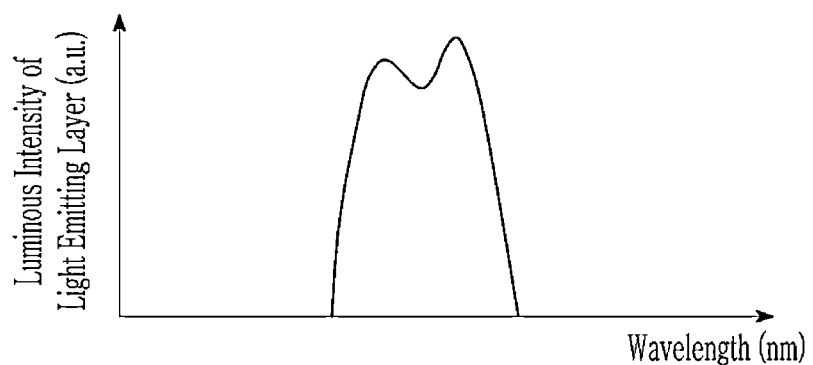
FIG. 10 is a schematic view showing an example of a change in the emission spectrum according to elongation of the stretchable strain sensor of FIG. 9.
Figure 10:
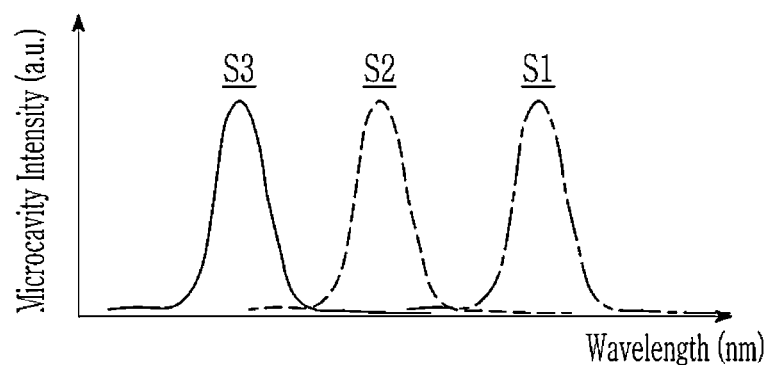
Figure 10:
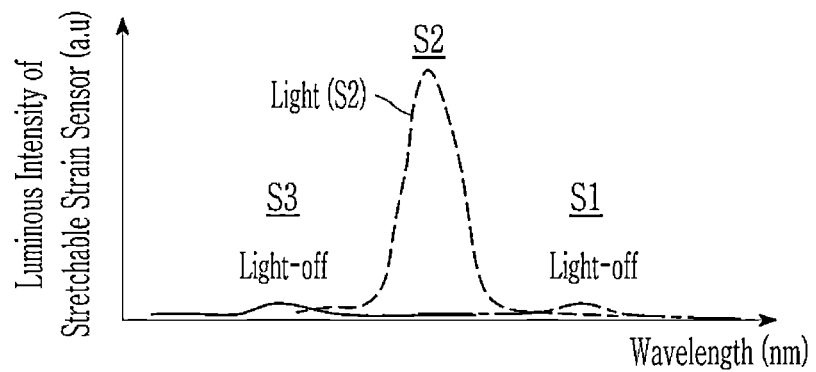

FIG. 9 is a schematic view showing an example of elongation of a stretchable strain sensor according to some example embodiments, and FIG. 10 is a schematic view showing an example of a change in the emission spectrum according to elongation of the stretchable strain sensor of FIG. 9.

Referring to FIGS. 9 and 10, the optoelectronic device 200 includes, in some example embodiments, a light emitting layer (red light emitting layer, green light emitting layer, or blue light emitting layer) configured to emit light of a portion of a wavelength spectrum belonging to a visible light wavelength spectrum, in some example embodiments, one of a red wavelength spectrum, a green wavelength spectrum, or a blue wavelength spectrum, and in a non-stretched state or an initial stretched state (first elongation (S1)), a wavelength spectrum corresponding to the resonance wavelength of microcavity may not be overlapped with the wavelength spectrum of the light emitting layer. In this case, since the wavelength spectrum emitted from the light emitting layer does not escape through the semi-transmissive electrode, the stretchable strain sensor 300 may not display a color (e.g., may not display any color, for example display a black appearance), in some example embodiments, black (Light-off).

Subsequently, when the stretchable strain sensor 300 is elongated at the second elongation rate (S2) higher than the first elongation rate (S1), the optical path length is decreased (from L1 to L2) due to the elongation, the wavelength spectrum of light intensified in the microcavity structure may be changed and shifted to the short wavelength spectrum, and when the second elongation rate (S2) is greater than or equal to the first threshold elongation rate, the wavelength spectrum corresponding to the resonance wavelength of the microcavity may be overlapped with the wavelength spectrum of the light emitting layer and display a color corresponding to the overlapped wavelength spectrum (Light-on). Herein, the first threshold elongation rate may be an elongation rate where the stretchable strain sensor 300 displays a color and, in some example embodiments, larger than the first elongation rate (S1) and smaller than or equal to the second elongation rate (S2).

Subsequently, when the stretchable strain sensor 300 is elongated at the third elongation rate (S3) higher than the second elongation rate (S2), the optical path length is additionally decreased (from L2 to L3) due to the elongation, the wavelength spectrum of light intensified in the microcavity structure is changed and thus may be further shifted toward the short wavelength spectrum, and when the third elongation rate (S3) is larger than the second threshold elongation rate, the wavelength spectrum corresponding to the resonance wavelength of the microcavity is not overlapped with the wavelength spectrum of the light emitting layer. In this case, since the wavelength spectrum emitted from the light emitting layer does not escape through the semi-transmissive electrode, the stretchable strain sensor 300 may not display a color again (e.g., may not display any color, for example display a black appearance), in some example embodiments, black (Light-off). Herein, the second threshold elongation rate may be an elongation rate where the stretchable strain sensor 300 displays no color and, in some example embodiments, larger than the second elongation rate (S2) and smaller than or equal to the third elongation rate (S3).

Accordingly, the stretchable strain sensor 300 according to some example embodiments may or may not display a color (e.g., may not display any color, for example display a black appearance) based on the threshold elongation rate and thus may be applied as a sensor displaying the color within a range between the first threshold elongation rate and the second threshold elongation rate. For example, where the light emitting layer is configured to emit light of one wavelength spectrum of a red wavelength spectrum, a green wavelength spectrum, or a blue wavelength spectrum, the optoelectronic device 200 may be configured to display a color corresponding to the one wavelength spectrum in response to the stretchable strain sensor 300 being elongated in the elongation direction at an elongation rate that is within a range between a first threshold elongation rate and a second threshold elongation rate, and the optoelectronic device 200 may be configured to not display the color (e.g., may not display any color, for example display a black appearance) in response to the stretchable strain sensor 300 being elongated in the elongation direction at an elongation rate that is outside the range between the first threshold elongation rate and the second threshold elongation rate, so as to be either below the first threshold elongation rate or above the second threshold elongation rate.

It will be understood that, in some example embodiments the light emitting layer is configured to emit light of a wide wavelength spectrum that encompasses some or all of the visible wavelength spectrum (e.g., the light emitting layer is configured to emit light that includes a combination of two or more, or all, of a red wavelength spectrum, a green wavelength spectrum, and a blue wavelength spectrum). The optoelectronic device 200 may be further configured to display a color corresponding to the entire wide wavelength spectrum (e.g., white light) or a limited portion of the wide wavelength spectrum (e.g., blue, green, or a combination thereof such as cyan) in response to the stretchable strain sensor 300 being elongated in the elongation direction at an elongation rate that is within a range between a first threshold elongation rate and a second threshold elongation rate. The optoelectronic device 200 may be configured to not display some or any colors corresponding to the wide wavelength spectrum (e.g., the optoelectronic device 200 may display a red color or display black) in response to the stretchable strain sensor 300 being elongated in the elongation direction at an elongation rate that is outside the range between the first threshold elongation rate and the second threshold elongation rate, so as to be either below the first threshold elongation rate or above the second threshold elongation rate, such that one or more colors corresponding to at least a limited portion of the wide wavelength spectrum are not displayed (or no colors are displayed at all, such that a black appearance is displayed).

As described above, the stretchable strain sensor 300 may be configured to display a color due to the elongation and its consequent strain variation, and accordingly, the elongation and strain degrees may be effectively detected. This stretchable strain sensor 300 may be configured to sense the elongation and the consequent strain variation along with the color change without an additional light source, a driven processor, and a complex circuit and is independent of the presence of external light and thus may be used both day and night.

Figure 11:
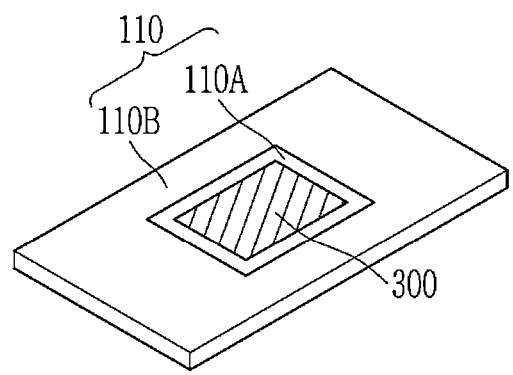
FIG. 11 is a schematic view showing an example of a stretchable strain sensor according to some example embodiments.

FIG. 11 is a schematic view showing an example of a stretchable strain sensor according to some example embodiments.

Referring to FIG. 11, the substrate 110 may include regions having different stiffnesses, in some example embodiments, a first region 110A having a first stiffness, a relatively high stiffness, and a second region 110B having a second stiffness, a relatively lower stiffness than the first region 110A. Herein, the stiffness indicates degree of resistance to deformation when an external impact is applied thereto, and when the stiffness is relatively high, the resistance to deformation is relatively large and results in small deformation, but when the stiffness is relatively low, the resistance to deformation is relatively small and thus results in large deformation.

The stiffness may be evaluated by an elastic modulus, wherein a high elastic modulus may indicate high stiffness, while a low elastic modulus may indicate low stiffness. The elastic modulus may be, in some example embodiments, a Young's modulus. An elastic modulus difference of the first region 110A and the second region 110B of the substrate 110 may be greater than or equal to about 100 times, and the elastic modulus of the first region 110A may be greater than or equal to about 100 times higher than that of the second region 110B. The elastic modulus difference of the first region 110A and the second region 110B may be about 100 times to about 100,000 times within the range, and the elastic modulus of the first region 110A may be about 100 times to about 100,000 times higher than that of the second region 110B, but is not limited thereto. In some example embodiments, the elastic modulus of the first region 110A may be about $10^7$ Pa to about $10^{12}$ Pa, and the elastic modulus of the second region 110B may be greater than or equal to about $10^2$ Pa and less than about $10^7$ Pa, but is not limited thereto.

The first region 110A and the second region 110B of the substrate 110 have different elongation rates due to the aforementioned stiffness difference, and the elongation rate of the second region 110B may be larger than that of the first region 110A. Herein, the elongation rate may be a percentage of a change of a length lengthened up to a breaking point with respect to the initial length. In some example embodiments, the elongation rate of the first region 110A of the substrate 110 may be less than or equal to about 5% and within the range, about 0% to about 5%, about 0% to about 4%, about 0% to about 3%, about 0% to about 2%, about 0% to about 1%, about 0.5% to about 5%, about 0.5% to about 4%, about 0.5% to about 3%, about 0.5% to about 2%, or about 1% to about 2%. In some example embodiments, the elongation rate of the second region 110B of the substrate 110 may be greater than or equal to about 10% and within the range, about 10% to about 300%, about 10% to about 200%, about 10% to about 100%, about 10% to about 90%, about 10% to about 80%, about 10% to about 70%, about 10% to about 60%, about 10% to about 50%, about 10% to about 40%, about 20% to about 70%, about 20% to about 60%, about 20% to about 50%, or about 20% to about 40%.

A plurality of the first regions 110A of the substrate 110 is separated one another as an island shape, and on each first region 110A of the substrate 110, the stretchable strain sensor 300 may be disposed. The stretchable strain sensor 300 is the same as described above.

The second region 110B of the substrate 110 may be the other region excluding the plurality of first region 110A and continuously connected. The second region 110B of the substrate 110 may be a region providing stretchability and thus flexibly respond to an external force or external motion such as twisting, pressing, or pulling due to relatively low stiffness and high elongation rate. As shown in FIG. 11, a substrate 110 may include a single first region 110A, or multiple first regions 110A, and a single second region 110B adjacent thereto, where the stretchable strain sensor 300, and thus the optoelectronic device 200, is in one or more first regions 110A of the substrate 110, or all first regions 110A of the substrate 110.

In some example embodiments, the first region 110A and the second region 110B of the substrate 110 may have different shapes, in some example embodiments, the first region 110A of the substrate 110 may be flat, while the second region 110B of the substrate 110 may include a 2-dimensional or 3-dimensional stretchable structure. The 2-dimensional or 3-dimensional stretched structure may have, in some example embodiments, a wavy shape, a wrinkle shape, a popup shape, or a non-coplanar mesh shape, but is not limited thereto.

In some example embodiments, the first region 110A and the second region 110B of the substrate 110 may include different materials, in some example embodiments, the first region 110A of the substrate 110 may include an inorganic material, an organic material, and/or an organic/inorganic material having relatively high stiffness and low elongation rate, while the second region 110B of the substrate 110 may include an inorganic material, an organic material, and/or organic/inorganic material having relatively low stiffness and high elongation rate. In some example embodiments, the first region 110A of the substrate 110 may include an organic material such as polycarbonate, polymethylmethacrylate, polyethylene terephthalate, polyethylene naphthalate, polyimide, polyamide, polyamideimide, polyether sulfone, or a combination thereof, carbon bodies such as diamond carbon, and the like and the second region 110B of the substrate 110 may include a substituted or unsubstituted polyorganosiloxane such as polydimethylsiloxane, an elastomer including a substituted or unsubstituted butadiene moiety such as styrene-ethylene-butylene-styrene, an organic or organic/inorganic elastomer such as an elastomer including a urethane moiety, an elastomer including an acrylic moiety, an elastomer including an olefin moiety, or a combination thereof; inorganic elastic materials such as ceramics, solid metals, liquid metals, or a combination thereof, but are not limited thereto.

In some example embodiments, the first region 110A and the second region 110B of the substrate 110 may be formed based on the same material to have different stiffness by varying a polymerization degree and/or a curing degree. In some example embodiments, the second region 110B of the substrate 110 may be formed by using polydimethylsiloxane but varying a polymerization degree, a type of hardener, a content and/or a curing temperature, and the like to have relatively lower stiffness than the first region 110A having relatively high stiffness.

In this way, since the substrate 110 includes the first region 110A having relatively high stiffness and a low elongation rate and the second region 110B having relatively low stiffness and a high elongation rate, and the stretchable strain sensor 300 is disposed in the first region 110A, when a large external force or motion is applied to the substrate 110, the stretchable strain sensor 300 disposed in the first region 110A receives relatively smaller strain and thus may be prevented from being damaged or destroyed due to the extreme strain.

This stretchable strain sensor 300 may be effectively applied to various devices or objects requiring stretchability, in some example embodiments, attachable devices such as wearable bioelectronics; skin-like devices; or smart clothing to obtain bio signals or motion signals, the objects whose strains are monitored, and the like to provide strain variation in real time. In some example embodiments, the stretchable strain sensor 300 may be applied to a patch-type or band-type attachable biological device, and when the attachable biological device is attached to the desired areas for treatment to quantitatively measure the movement of muscles or joints and obtain the data needed for rehabilitation.

In some example embodiments, the aforementioned stretchable strain sensor 300 may be applied in the form of an array arranged in rows and/or columns.

Figure 12:
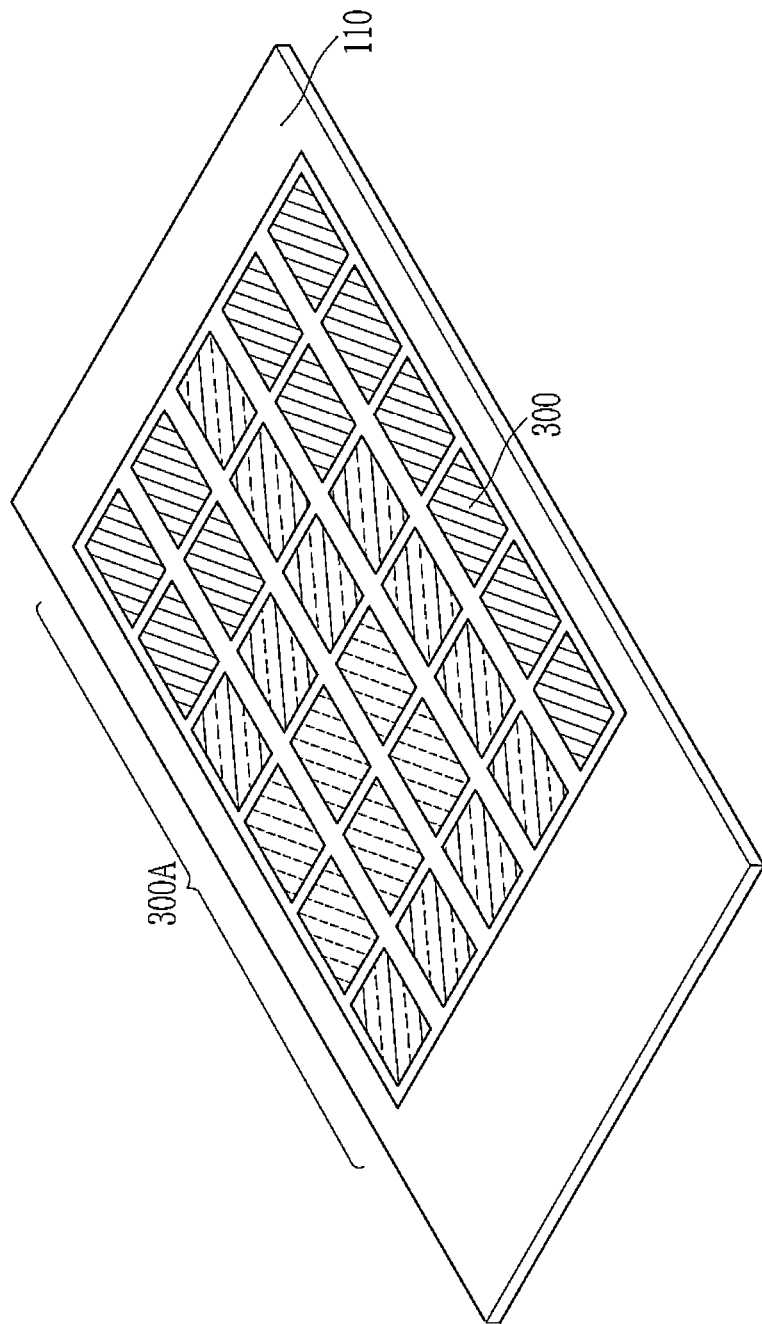
FIG. 12 is a schematic view showing an example of a stretchable strain sensor array including stretchable strain sensors according to some example embodiments.

FIG. 12 is a schematic view showing an example of a stretchable strain sensor array including stretchable strain sensors according to some example embodiments.

Referring to FIG. 12, the stretchable strain sensor array 300A includes a plurality of stretchable strain sensors 300 arranged on the substrate 110. The plurality of stretchable strain sensors 300 is illustrated as an example arranged in rows and columns but is not limited thereto and may be variously arranged.

The plurality of stretchable strain sensors 300 may be operated independently of each other and, as described above, display colors according to the elongation and strain variation thereof. Accordingly, some of the plurality of stretchable strain sensor 300 may be configured to sense color changes and accordingly, effectively detect where strain variations occurs.

In some example embodiments, an attachable biological device including the stretchable strain sensor array 300A is attached to an area for treatment to effectively detect where strain occurs from muscle or joint movements and effectively obtain the data needed for rehabilitation.

In some example embodiments, a device including the stretchable strain sensor array 300A is attached to objects that need to be monitored and evaluated for strain variation such as bridges, vehicles, or aircrafts to effectively detect where the strains occur and thus effectively obtain the data for safety and calibration.

In some example embodiments, the aforementioned stretchable strain sensor 300 may be applied as a strain indicator.

Figure 13:
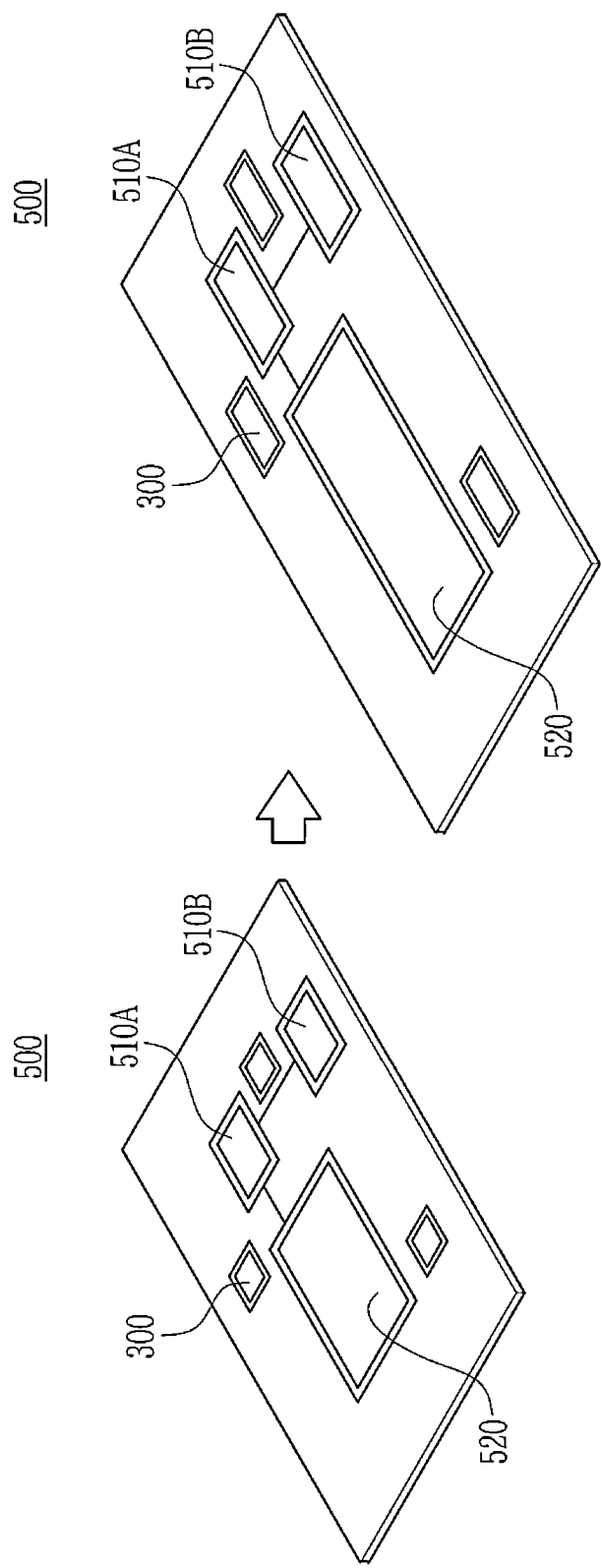
FIG. 13 is a schematic view showing an example of a device including a stretchable strain sensor according to some example embodiments.

FIG. 13 is a schematic view showing an example of a device including a stretchable strain sensor according to some example embodiments.

The device 500 may be an attachable device and include sensors 510A and 510B performing the same or different functions, a display 520 showing the results sensed by the sensors 510A and 510B, and at least one stretchable strain sensor 300. The stretchable strain sensor 300 may be disposed on different positions and thus warn as color marks in areas relatively vulnerable to elongations and strains and accordingly, indicate that the limit of the mechanical strength of the device 500 has been reached according to this warning.

Hereinafter, some example embodiments are illustrated in more detail with reference to examples. However, the present scope of the example embodiments is not limited these examples.

Design of Stretchable Strain Sensors

The stretchable strain sensors according to FIGS. 1 and 2 are designed and optical simulations of the stretchable strain sensors are performed using MATLAB software.

Example 1

A structure of a stretchable strain sensor is set as follows.
Emission spectrum of the light emitting layer: 400 nm to 750 nm (white light)
Reflective electrode: Ga—In liquid metal 100 nm (reflectance>95%)
Semi-transmissive electrode: Ga—In liquid metal 25 nm (reflectance: about 25%)
Gap between reflective electrode and semi-transmissive electrode (optical path length): 320 nm
When the elongation rate is increased by 30%, a decrease rate of the optical path length is 34% (Elongation simulation is performed based on SEBS stretchable substrate (SEBS1052, modulus 13 MPa) using COMSOL Multiphysics software)

Figure 14:
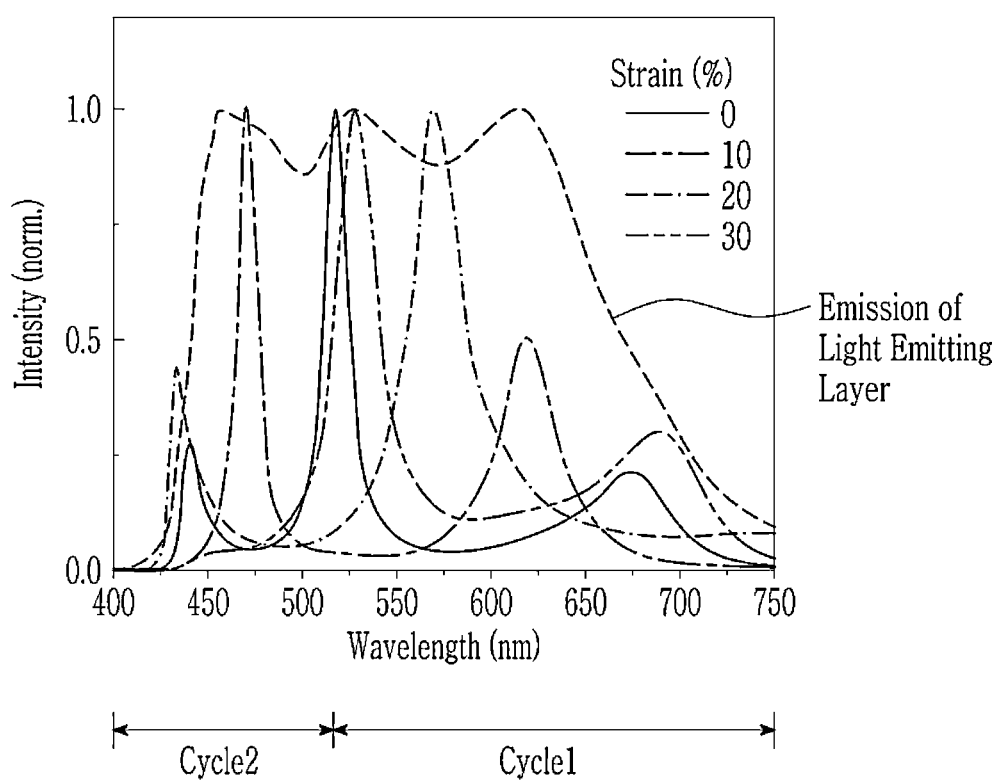
FIG. 14 is a graph showing changes in emission spectrum according to strain (elongation) of the stretchable strain sensor according to Example 1.
Figure 15:
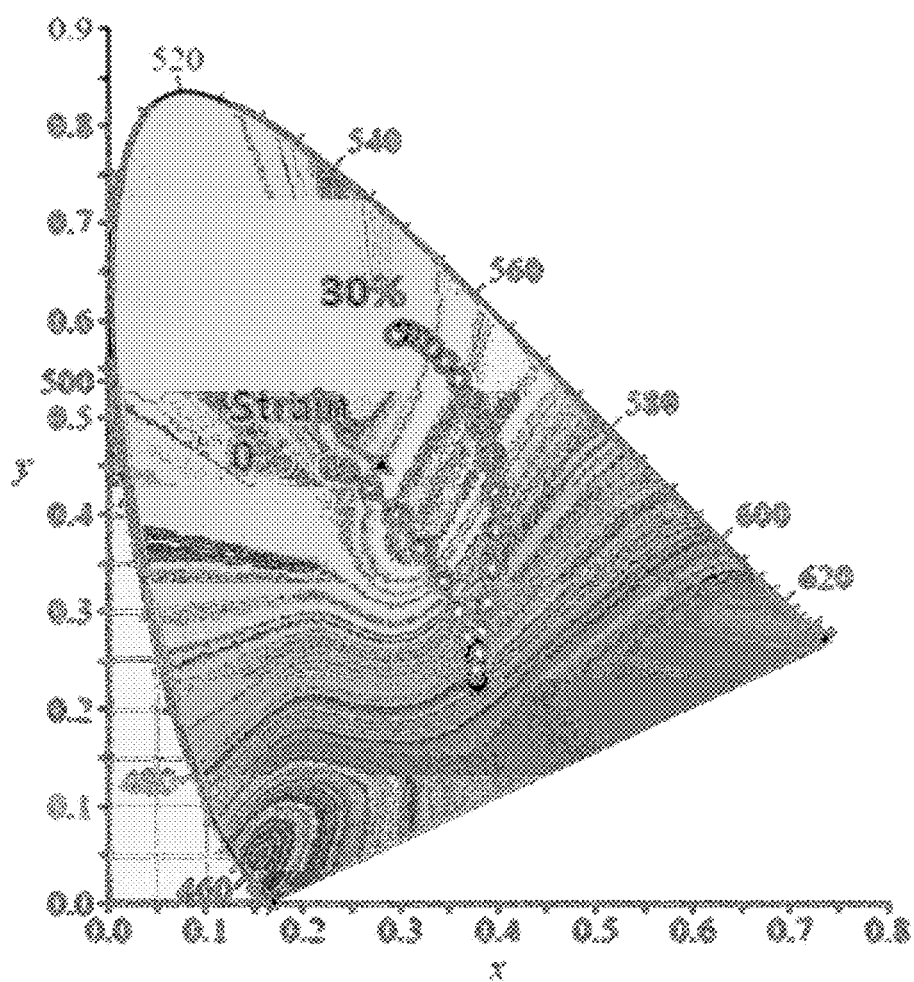
FIG. 15 is a color coordinate showing changes in color according to the strain (elongation) of the stretchable strain sensor according to Example 1.

FIGS. 14 and 15 show changes in the wavelength spectrum according to the elongation rate.

FIG. 14 is a graph showing changes in emission spectrum according to strain (elongation) of the stretchable strain sensor according to Example 1, and FIG. 15 is a color coordinate showing changes in color according to the strain (elongation) of the stretchable strain sensor according to Example 1.

Referring to FIGS. 14 and 15, as the strain (elongation) is increased, a wavelength spectrum due to the microcavity is shifted toward a short wavelength spectrum, and a color displayed is changed as the strain (elongation) is increased.

Example 2

A structure of a stretchable strain sensor is set as follows.
Emission spectrum of the light emitting layer: the maximum emission wavelength from 500 nm to 550 nm (green light)
Reflective electrode: Ga—In liquid metal 100 nm (reflectance>95%)
Semi-transmissive electrode: Ga—In liquid metal 25 nm (reflectance: about 25%)
Gap between reflective electrode and semi-transmissive electrode (optical path length): 310 nm
When the elongation rate is increased by 30%, a decrease rate of the optical path length is 34%

Figure 16:
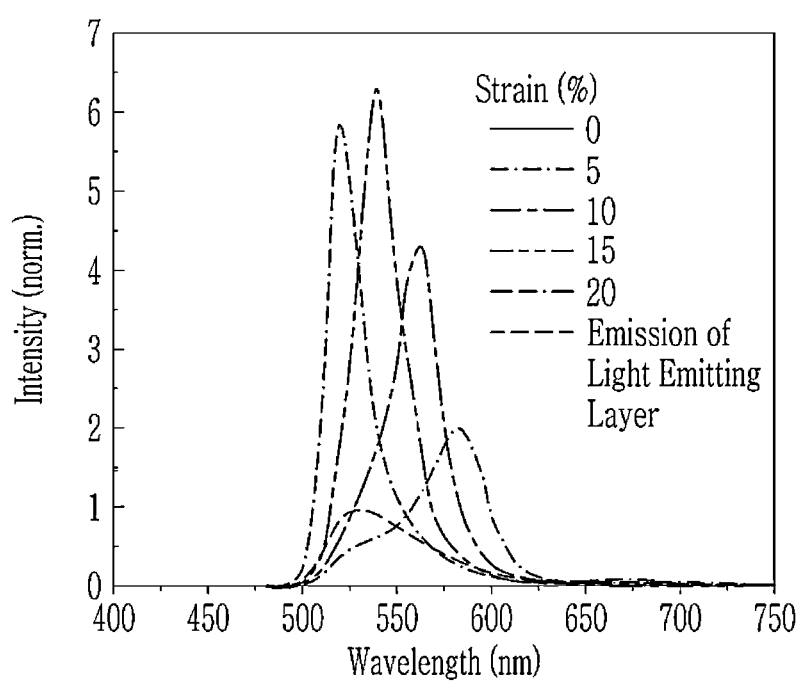
FIG. 16 is a graph showing changes in emission spectrum according to strain (elongation) of the stretchable strain sensor according to Example 2.
Figure 17:
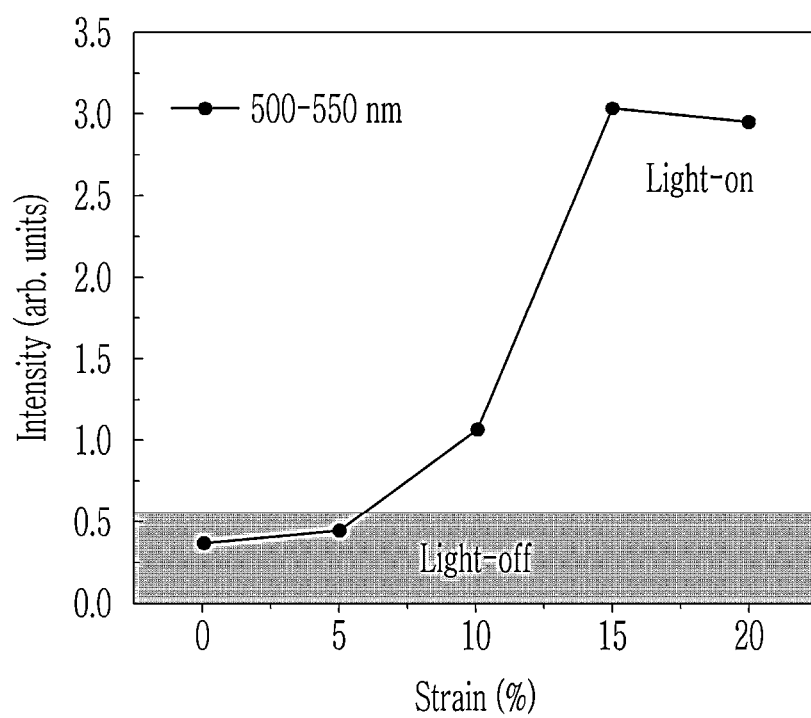
FIG. 17 is a graph showing light emission on-off according to strain (elongation) of the stretchable strain sensor according to Example 2.

FIGS. 16 and 17 show changes in the wavelength spectrum according to the elongation rate.

FIG. 16 is a graph showing changes in emission spectrum according to strain (elongation) of the stretchable strain sensor according to Example 2 and FIG. 17 is a graph showing light emission on-off according to strain (elongation) of the stretchable strain sensor according to Example 2.

Referring to FIGS. 16 and 17, as the strain (elongation) is increased, the wavelength spectrum due to the microcavity is shifted toward the short wavelength spectrum, light is emitted (light-on) where an emission spectrum of a light emitting layer is overlapped with the emission spectrum due to the microcavity.

Example 3

A structure of a stretchable strain sensor is set as follows.
Emission spectrum of the light emitting layer: 400 nm to 750 nm (white light)
Reflective electrode: Ga—In liquid metal 100 nm (reflectance>95%)
Semi-transmissive electrode: Ga—In liquid metal 25 nm (reflectance: about 25%)
Gap between reflective electrode and semi-transmissive electrode (optical path length): 140 nm
When the elongation rate is increased by 30%, a decrease rate of the optical path length is 34%

Figure 18:
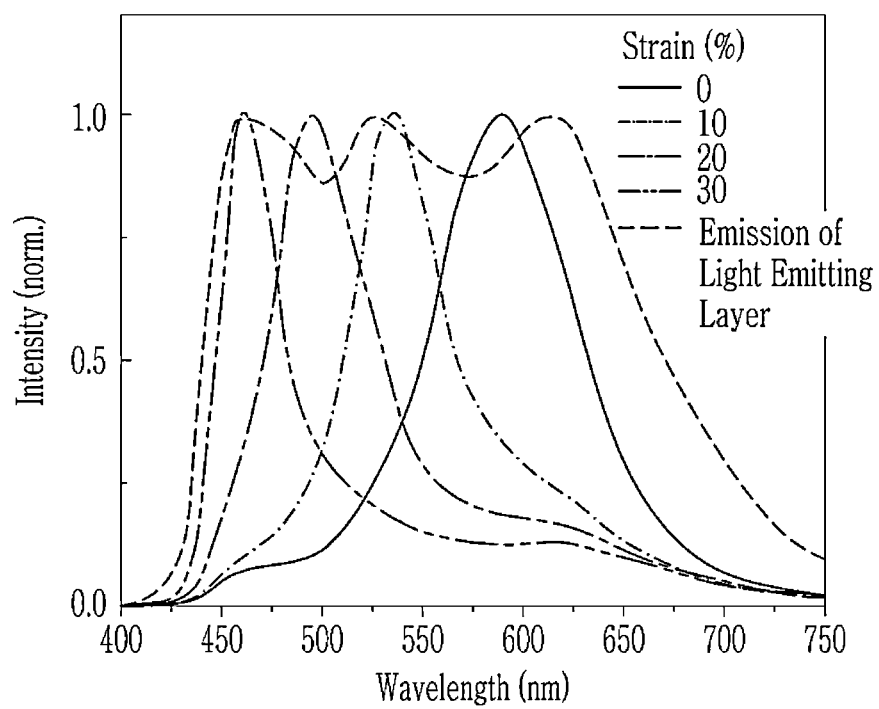
FIG. 18 is a graph showing changes in emission spectrum according to strain (elongation) of the stretchable strain sensor according to Example 3.
Figure 19:
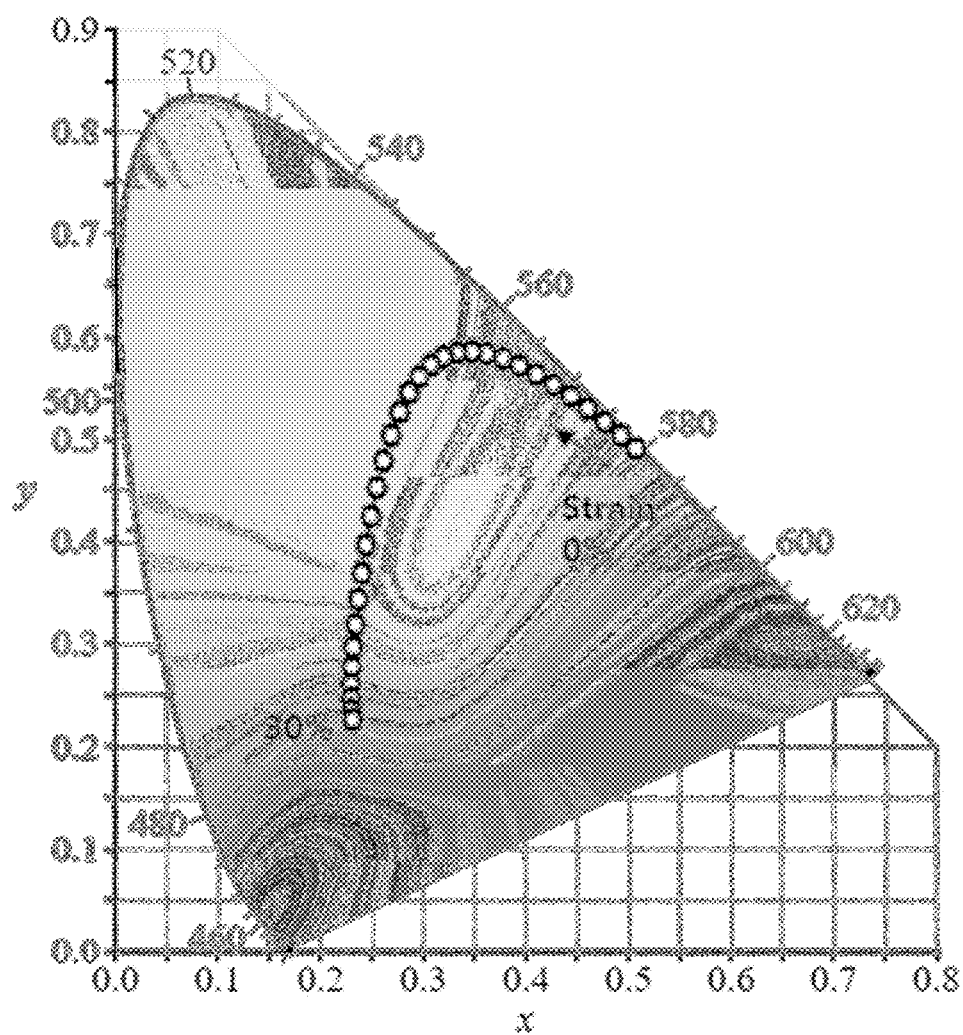
FIG. 19 is a graph showing light emission on-off according to strain (elongation) of the stretchable strain sensor according to Example 3.

FIGS. 18 and 19 show changes in the wavelength spectrum according to the elongation rate.

FIG. 18 is a graph showing changes in emission spectrum according to strain (elongation) of the stretchable strain sensor according to Example 3 and FIG. 19 is a graph showing light emission on-off according to strain (elongation) of the stretchable strain sensor according to Example 3.

Referring to FIGS. 18 and 19, as the strain (elongation) is increased, the wavelength spectrum due to the microcavity is shifted to the short wavelength spectrum, and the color displayed is changed as the strain (elongation) is increased.

While the inventive concepts have been described in connection with what is presently considered to be practical example embodiments, it is to be understood that the inventive concepts are not limited to the disclosed example embodiments. On the contrary, the inventive concepts are intended to cover various modifications and equivalent arrangements included within the spirit and scope of the appended claims.

What is claimed is:

1. A stretchable strain sensor, the stretchable strain sensor configured to exhibit wavelength selectivity according to a thickness change of a thickness of the stretchable strain sensor, in a thickness direction extending parallel to the thickness of the stretchable strain sensor, due to elongation of the stretchable strain sensor in an elongation direction extending perpendicular to the thickness direction,
wherein the stretchable strain sensor comprises an optoelectronic device, the optoelectronic device being configured to display one or more colors according to the thickness change of the thickness of the stretchable strain sensor in the thickness direction due to elongation of the stretchable strain sensor in the elongation direction, and
wherein,
the optoelectronic device is configured to not display a color in response to the stretchable strain sensor being elongated in the elongation direction at an elongation rate that is below a threshold elongation rate, and the optoelectronic device is configured to display the color in response to the stretchable strain sensor being elongated in the elongation direction at an elongation rate that is at or above the threshold elongation rate, or
the optoelectronic device is configured to display a color in response to the stretchable strain sensor being elongated in the elongation direction at an elongation rate that is below a threshold elongation rate, and the optoelectronic device is configured to not display the color in response to the stretchable strain sensor being elongated in the elongation direction at an elongation rate that is at or above the threshold elongation rate, or
the optoelectronic device is configured to display a color in response to the stretchable strain sensor being elongated in the elongation direction at an elongation rate that is within a range between a first threshold elongation rate and a second threshold elongation rate, and the optoelectronic device is configured to not display the color in response to the stretchable strain sensor being elongated in the elongation direction at an elongation rate that is outside the range between the first threshold elongation rate and the second threshold elongation rate, so as to be below the first threshold elongation rate or above the second threshold elongation rate.

2. A stretchable strain sensor, the stretchable strain sensor configured to exhibit wavelength selectivity according to a thickness change of a thickness of the stretchable strain sensor, in a thickness direction extending parallel to the thickness of the stretchable strain sensor, due to elongation of the stretchable strain sensor in an elongation direction extending perpendicular to the thickness direction,
wherein the stretchable strain sensor comprises an optoelectronic device, the optoelectronic device being configured to display one or more colors according to the thickness change of the thickness of the stretchable strain sensor in the thickness direction due to elongation of the stretchable strain sensor in the elongation direction, wherein the optoelectronic device includes
a first electrode including a reflective layer,
a second electrode facing the first electrode, the second electrode being spaced apart from the reflective layer by an optical path length, and
a light emitting layer between the first electrode and the second electrode.

3. The stretchable strain sensor of claim 2, wherein
as a rate of the elongation increases, the optical path length is shorter, and
the optoelectronic device is configured to display a color of a wavelength spectrum corresponding to the optical path length according to a change in the optical path length.

4. The stretchable strain sensor of claim 3, wherein
the light emitting layer is configured to emit white light, and
the optoelectronic device is configured to display a color of a portion of a visible light spectrum.

5. The stretchable strain sensor of claim 4, wherein
the optoelectronic device is configured to display a color of a first wavelength spectrum in response to the stretchable strain sensor being elongated in the elongation direction at a first elongation rate,
the optoelectronic device is configured to display a color of a second wavelength spectrum in response to the stretchable strain sensor being elongated in the elongation direction at a second elongation rate, the second wavelength spectrum being a shorter wavelength region than the first wavelength spectrum, the second elongation rate being higher than the first elongation rate, and
the optoelectronic device is configured to display a color of a third wavelength spectrum in response to the stretchable strain sensor being elongated in the elongation direction at a third elongation rate, the third wavelength spectrum being a shorter wavelength region than the second wavelength spectrum, the third elongation rate being higher than the second elongation rate.

6. The stretchable strain sensor of claim 3, wherein
the light emitting layer is configured to emit light of one wavelength spectrum of a red wavelength spectrum, a green wavelength spectrum, or a blue wavelength spectrum, and
the optoelectronic device is configured to not display a color corresponding to the one wavelength spectrum in response to the stretchable strain sensor being elongated in the elongation direction at an elongation rate that is below a threshold elongation rate, and
the optoelectronic device is configured to display the color in response to the stretchable strain sensor being elongated in the elongation direction at an elongation rate that is at or above the threshold elongation rate.

7. The stretchable strain sensor of claim 3, wherein
the light emitting layer is configured to emit light of one wavelength spectrum of a red wavelength spectrum, a green wavelength spectrum, or a blue wavelength spectrum, and
the optoelectronic device is configured to display a color corresponding to the one wavelength spectrum in response to the stretchable strain sensor being elongated in the elongation direction at an elongation rate that is below a threshold elongation rate,
the optoelectronic device is configured to not display the color in response to the stretchable strain sensor being elongated in the elongation direction at an elongation rate that is at or above the threshold elongation rate.

8. The stretchable strain sensor of claim 3, wherein
the light emitting layer is configured to emit light of one wavelength spectrum of a red wavelength spectrum, a green wavelength spectrum, or a blue wavelength spectrum, and
the optoelectronic device is configured to display a color corresponding to the one wavelength spectrum in response to the stretchable strain sensor being elongated in the elongation direction at an elongation rate that is within a range between a first threshold elongation rate and a second threshold elongation rate, and
the optoelectronic device is configured to not display the color in response to the stretchable strain sensor being elongated in the elongation direction at an elongation rate that is outside the range between the first threshold elongation rate and the second threshold elongation rate, so as to be either below the first threshold elongation rate or above the second threshold elongation rate.

9. The stretchable strain sensor of claim 2, wherein
the second electrode is a semi-transmissive electrode.

10. The stretchable strain sensor of claim 2, wherein each of the first electrode and the second electrode is a stretchable electrode.

11. A stretchable strain sensor, the stretchable strain sensor configured to have an emission spectrum that changes according to strain variation of a strain on the stretchable strain sensor, wherein
the stretchable strain sensor includes an optoelectronic device, and
the optoelectronic device includes
a first electrode including a reflective layer,
a second electrode facing the first electrode, the second electrode being spaced apart from the reflective layer by an optical path length, and
a light emitting layer between the first electrode and the second electrode.

12. The stretchable strain sensor of claim 11, wherein
the light emitting layer is configured to emit white light, and
the optoelectronic device is configured to display a color of a first wavelength spectrum in response to the stretchable strain sensor being elongated at a first elongation rate,
the optoelectronic device is configured to display a color of a second wavelength spectrum in response to the stretchable strain sensor being elongated at a second elongation rate, the second wavelength spectrum being a shorter wavelength spectrum than the first wavelength spectrum, the second elongation rate being higher than the first elongation rate,
the optoelectronic device is configured to display a color of a third wavelength spectrum in response to the stretchable strain sensor being elongated at a third elongation rate, the third wavelength spectrum being a shorter wavelength spectrum than the second wavelength spectrum, the third elongation rate being higher than the second elongation rate, and
the first wavelength spectrum, the second wavelength spectrum, and the third wavelength spectrum are within a visible wavelength spectrum.

13. The stretchable strain sensor of claim 11, wherein
the light emitting layer is configured to emit light of one wavelength spectrum of a red wavelength spectrum, a green wavelength spectrum, or a blue wavelength spectrum,
the optoelectronic device is configured to not display a color corresponding to the one wavelength spectrum in response to the stretchable strain sensor being elongated at an elongation rate that is below a threshold elongation rate, and
the optoelectronic device is configured to display the color in response to the stretchable strain sensor being elongated at an elongation rate that is at or above the threshold elongation rate.

14. The stretchable strain sensor of claim 11, wherein
the light emitting layer is configured to emit light of one wavelength spectrum of a red wavelength spectrum, a green wavelength spectrum, or a blue wavelength spectrum,
the optoelectronic device is configured to display a color corresponding to one wavelength spectrum in response to the stretchable strain sensor being elongated at an elongation rate that is below a threshold elongation rate, and
the optoelectronic device is configured to not display the color in response to the stretchable strain sensor being elongated at an elongation rate that is at or above the threshold elongation rate.

15. The stretchable strain sensor of claim 11, wherein
the light emitting layer is configured to emit light of one wavelength spectrum of a red wavelength spectrum, a green wavelength spectrum, or a blue wavelength spectrum,
the optoelectronic device is configured to display a color corresponding to the one wavelength spectrum in response to the stretchable strain sensor being elongated at an elongation rate that is within a range between a first threshold elongation rate and a second threshold elongation rate, and
the optoelectronic device is configured to not display the color in response to the stretchable strain sensor being elongated at an elongation rate that is outside the range between the first threshold elongation rate and the second threshold elongation rate, so as to be either below the first threshold elongation rate or above the second threshold elongation rate.

\* \* \* \* \*